(12) United States Patent
Korony et al.

(10) Patent No.: US 9,722,568 B2
(45) Date of Patent: Aug. 1, 2017

(54) THIN FILM SURFACE MOUNT COMPONENTS

(71) Applicant: AVX Corporation, Fountain Inn, SC (US)

(72) Inventors: Gheorghe Korony, Myrtle Beach, SC (US); Andrew P. Ritter, Simpsonville, SC (US)

(73) Assignee: AVX Corporation, Fountain Inn, SC (US)

( * ) Notice: Subject to any disclaimer, the term of this patent is extended or adjusted under 35 U.S.C. 154(b) by 0 days.

(21) Appl. No.: 15/202,793

(22) Filed: Jul. 6, 2016

(65) Prior Publication Data

US 2016/0345444 A1 Nov. 24, 2016

Related U.S. Application Data

(62) Division of application No. 12/904,315, filed on Oct. 14, 2010, now Pat. No. 9,450,556.

(Continued)

(51) Int. Cl.
*B32B 37/00* (2006.01)
*H03H 7/01* (2006.01)
(Continued)

(52) U.S. Cl.
CPC .............. *H03H 7/17* (2013.01); *H01C 1/148* (2013.01); *H01C 7/006* (2013.01); *H01F 5/003* (2013.01);
(Continued)

(58) Field of Classification Search
CPC  H01L 2924/19041; H01L 2924/19042; H01C 7/006; H01C 1/148; H03H 7/17; H05K 1/111; H05K 3/467
(Continued)

(56) References Cited

U.S. PATENT DOCUMENTS 5,166,656 A * 11/1992 Badihi ................. H01C 17/006
                                                         337/227
5,228,188 A *  7/1993 Badihi ................. H01C 17/006
                                                          29/412

(Continued)

OTHER PUBLICATIONS

English Translation of Office Action issued in Chinese Patent Application No. 201010621677.9; Jun. 12, 2014.

*Primary Examiner* — Timothy Thompson
*Assistant Examiner* — Rhadames J Alonzo Miller
(74) *Attorney, Agent, or Firm* — Dority & Manning, P.A.

(57) ABSTRACT

Surface mount components and related methods involve thin film circuits between first and second insulating substrates. The thin film circuits may include passive components, including resistors, capacitors, inductors, arrays of such components, networks, or filters of multiple passive components. Such thin film circuit(s) can be sandwiched between first and second insulating substrates with internal conductive pads which are exposed to the outside of the surface mount component and electrically connected to external terminations. External terminations may include at least one layer of conductive polymer. Optional shield layers may protect the surface mount components from signal interference. A cover substrate may be formed with a plurality of conductive elements that are designed to generally align with the conductive pads such that conductive element portions are exposed in groups along surfaces of a device.

22 Claims, 16 Drawing Sheets

Related U.S. Application Data

(60) Provisional application No. 61/252,340, filed on Oct. 16, 2009, provisional application No. 61/252,335, filed on Oct. 16, 2009.

(51) Int. Cl.

| | | |
|---|---|---|
| *H01C 1/148* | (2006.01) | |
| *H01C 7/00* | (2006.01) | |
| *H01F 5/00* | (2006.01) | |
| *H01G 4/224* | (2006.01) | |
| *H01G 4/248* | (2006.01) | |
| *H01G 4/33* | (2006.01) | |
| *H01F 27/28* | (2006.01) | |
| *H05K 1/11* | (2006.01) | |
| *H05K 1/18* | (2006.01) | |
| *H05K 3/46* | (2006.01) | |
| *H03H 1/00* | (2006.01) | |

(52) U.S. Cl.
CPC ......... *H01F 27/2804* (2013.01); *H01G 4/224* (2013.01); *H01G 4/248* (2013.01); *H01G 4/33* (2013.01); *H03H 7/0115* (2013.01); *H05K 1/111* (2013.01); *H05K 1/186* (2013.01); *H05K 3/467* (2013.01); *H05K 3/4611* (2013.01); *H05K 3/4697* (2013.01); *H01F 2027/2809* (2013.01); *H01L 2924/0002* (2013.01); *H03H 2001/0085* (2013.01); *Y10T 29/49124* (2015.01)

(58) Field of Classification Search
USPC ........... 361/821, 760–795; 337/297; 156/250
See application file for complete search history.

(56) References Cited

U.S. PATENT DOCUMENTS

| | | | | |
|---|---|---|---|---|
| 5,296,833 A * | 3/1994 | Breen | ................... | H01C 17/006 29/623 |
| 6,757,152 B2 | 6/2004 | Galvagni et al. | | |
| 6,761,963 B2 * | 7/2004 | Casper | ................... | H01L 28/60 174/257 |
| 6,890,629 B2 * | 5/2005 | Casper | ................ | H01L 23/5223 174/257 |
| 6,898,070 B2 | 5/2005 | Korony et al. | | |
| 6,960,366 B2 * | 11/2005 | Ritter | ................... | C23C 18/1605 29/25.41 |
| 7,463,474 B2 | 12/2008 | Ritter et al. | | |
| 7,576,968 B2 * | 8/2009 | Ritter | ..................... | H01G 4/232 361/306.1 |
| 8,208,266 B2 | 6/2012 | Korony | | |
| 8,339,802 B2 * | 12/2012 | Lotfi | ................... | H01F 27/2804 361/777 |
| 8,689,417 B2 | 4/2014 | Christian et al. | | |
| 2002/0085334 A1 * | 7/2002 | Figueroa | .................. | H01G 4/30 361/301.4 |
| 2002/0089810 A1 * | 7/2002 | Casper | .................... | H01L 28/60 361/306.3 |
| 2002/0126438 A1 | 9/2002 | Liu | | |
| 2002/0131254 A1 * | 9/2002 | Schaper | ................. | H05K 1/023 361/760 |
| 2004/0022042 A1 * | 2/2004 | Mok | .................. | G01R 1/07371 361/792 |
| 2004/0066605 A1 * | 4/2004 | Trinh | ................... | H01G 4/2325 361/321.2 |
| 2004/0090732 A1 * | 5/2004 | Ritter | ................... | C23C 18/1605 361/306.1 |
| 2004/0160753 A1 * | 8/2004 | Vrtis | ....................... | H01L 23/50 361/783 |
| 2004/0257748 A1 * | 12/2004 | Ritter | ..................... | H01G 4/012 361/306.3 |
| 2005/0073818 A1 * | 4/2005 | Hirano | ..................... | H01G 4/40 361/763 |
| 2005/0146837 A1 * | 7/2005 | Ritter | ..................... | H01G 4/012 361/306.1 |
| 2006/0158825 A1 * | 7/2006 | Hidaka | .................. | H01G 4/012 361/303 |
| 2007/0014075 A1 * | 1/2007 | Ritter | ..................... | H01G 4/232 361/306.3 |
| 2007/0019363 A1 * | 1/2007 | Roy | ....................... | H01G 4/012 361/303 |
| 2007/0019364 A1 * | 1/2007 | Roy | ....................... | H01G 4/012 361/303 |
| 2007/0019365 A1 * | 1/2007 | Roy | ....................... | H01G 4/012 361/303 |
| 2007/0103846 A1 * | 5/2007 | Eggerding | ............. | H01C 1/142 361/306.3 |
| 2008/0212258 A1 * | 9/2008 | Fukui | .................. | H01G 4/0085 361/305 |
| 2010/0188799 A1 * | 7/2010 | Galvagni | ............... | H01G 4/012 361/306.3 |
| 2010/0265031 A1 * | 10/2010 | Yen | ..................... | H01H 69/022 337/297 |
| 2011/0043963 A1 * | 2/2011 | Bultitude | .................. | H01G 2/16 361/321.4 |
| 2012/0069523 A1 * | 3/2012 | Kapusta | ............... | H05K 1/0218 361/704 |

\* cited by examiner

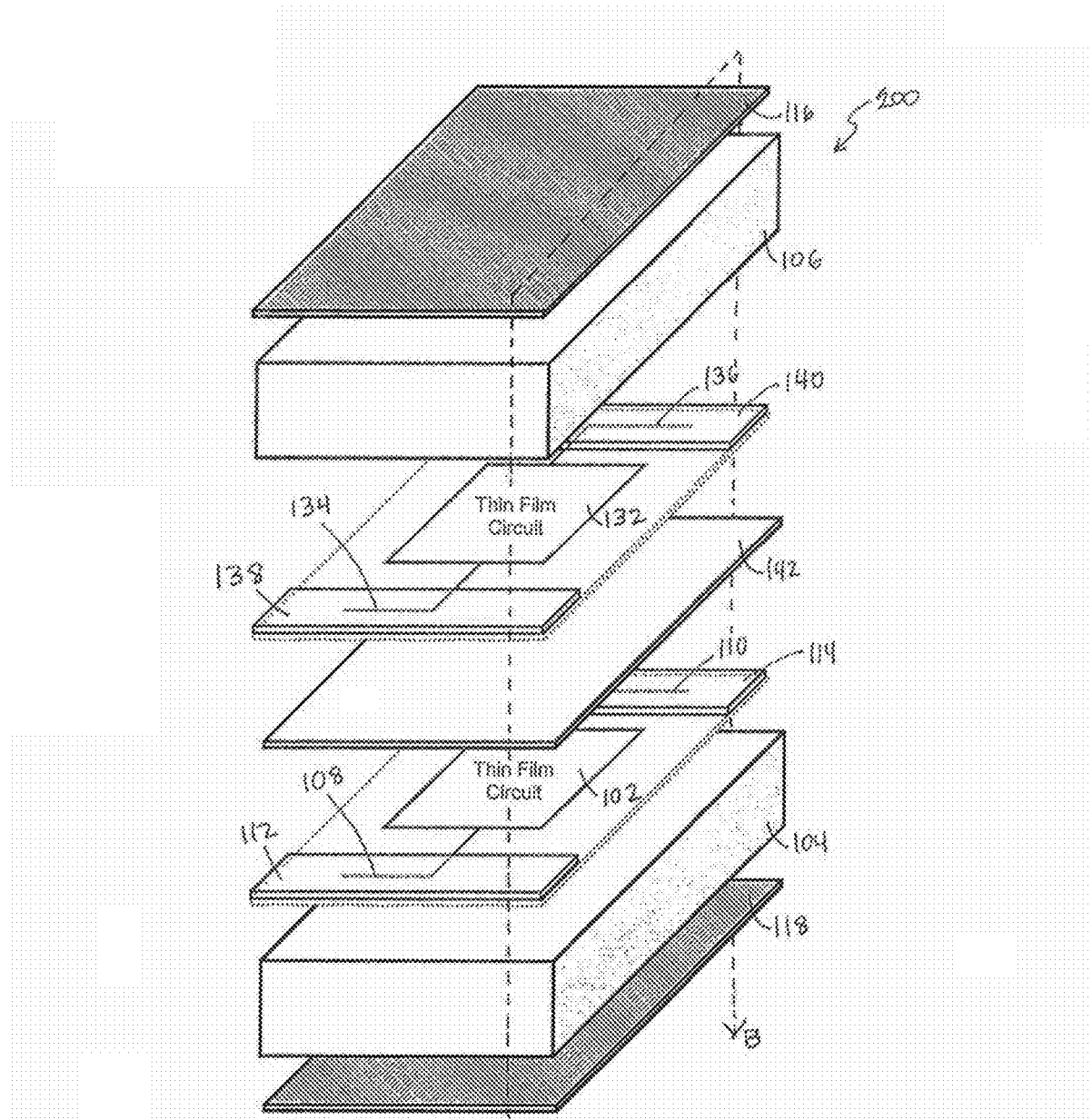
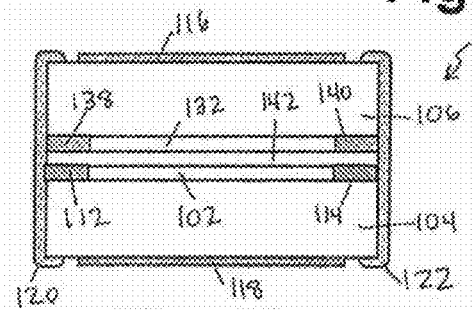
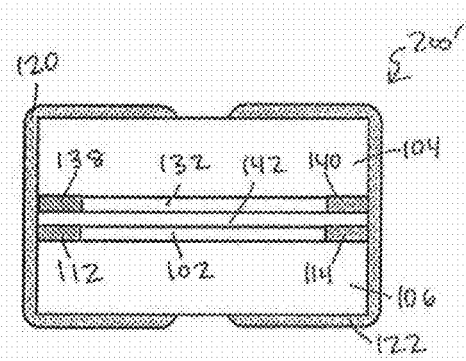
Fig. 2A
Fig. 2B
Fig. 2C

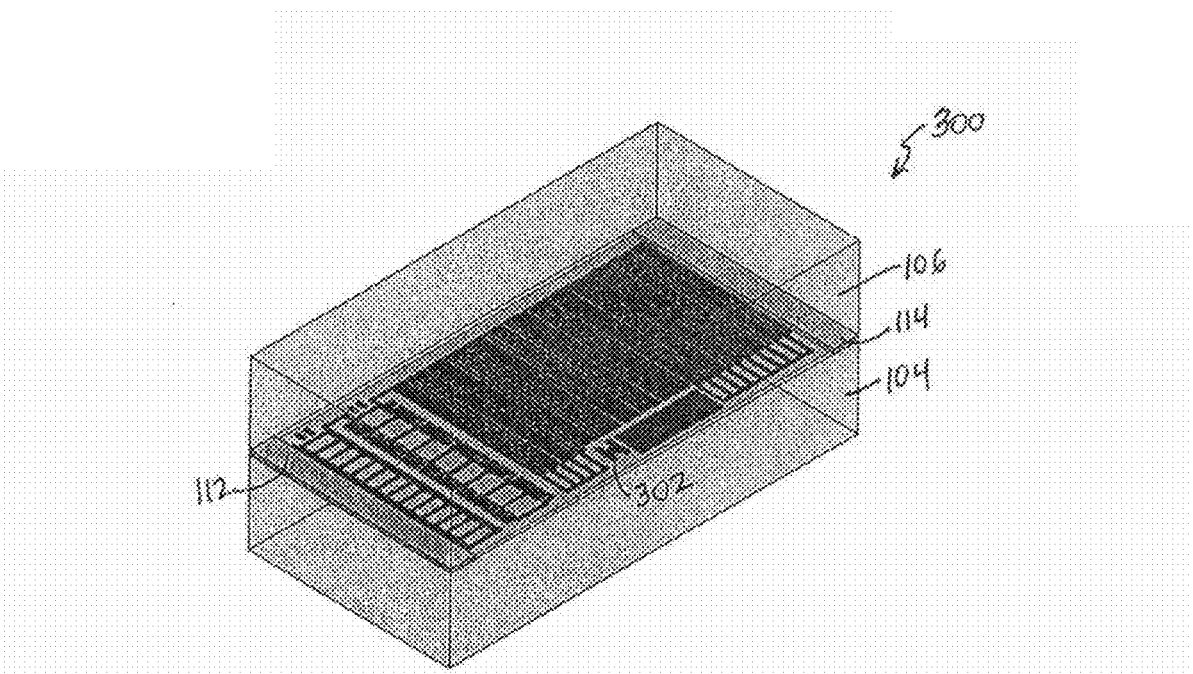
Fig. 3
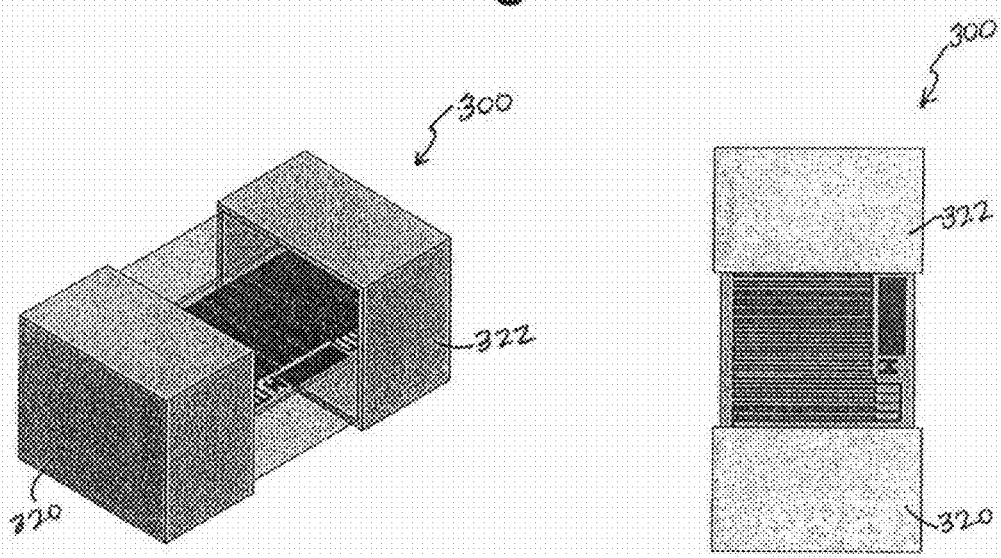
Fig. 4
Fig. 5

THIN FILM SURFACE MOUNT COMPONENTS

PRIORITY CLAIM

This application is a divisional of prior pending U.S. patent application Ser. No. 12/904,315 filed Oct. 14, 2010 entitled "THIN FILM SURFACE MOUNT COMPONENTS", which claims the benefit of previously filed U.S. Provisional Patent Application of the same title assigned 61/252,340, as filed Oct. 16, 2009, and claims the benefit of previously filed U.S. Provisional Patent Application also of the same title assigned U.S. Ser. No. 61/252,335, filed Oct. 16, 2009, all of which are hereby incorporated herein by reference in their entireties for all purposes. Any disclaimer that may have occurred during prosecution of the above-referenced application(s) is hereby expressly rescinded.

FIELD OF THE INVENTION

The present subject matter generally relates to small electronic components adapted for mounting on a circuit board or other surface-mountable location. More particularly, the present subject matter relates to surface mount components having one or more thin film circuits of passive components for use in a variety of applications, as well as related methods for producing such devices.

BACKGROUND OF THE INVENTION

For some time, the design of various electronic components has been driven by a general industry trend toward miniaturization. For example, it may be desirable in certain applications to have very small devices including passive components such as resistors, capacitors, inductors, or combinations of such components. It may be desirable in other applications to have very small devices that include some combination of passive components to provide additional circuit functionality, such as filter circuits for various applications including low-pass, electro-magnetic interference (EMI) and radio frequency interference (RFI) filtering.

The size and arrangement of termination features for an electronic component has also been an important feature of such components. Relatively larger termination features can require valuable real estate within an electronic component, thus limiting potential component miniaturization. Larger termination features may also introduce higher levels of equivalent series inductance (ESL), which can yield undesirable effects in circuit performance, especially at high operating frequencies.

Some known termination arrangements for small electronic components correspond to wire bonding, ball grid array (BGA) and/or land grid array (LGA) techniques and others. Such techniques often require a significant amount of component real estate on the active component surface(s) for the formation of solder balls or lands. In addition, components having such termination arrangements are often limited to mounting on only one side of a component. For example, BGA and LGA devices are often formed for inverted mounting to a surface. Wire bonding also often requires connection from a given location on an electronic component to mounting locations on a surface.

The BGA technique illustrated in FIG. 15 as well as other known techniques such as LGA and wire bonding not only often require a significant amount of component real estate on the active component surface(s) for the formation of solder balls or lands, but also typically add substantial cost to the finished component. In addition, components having such termination arrangements are often limited to mounting on only one side of a component. For example, BGA and LGA devices are often formed for inverted mounting to a surface. Wire bonding also often requires connection from a given location on an electronic component to mounting locations on a surface.

In addition, thin film devices are sometimes limited to having circuit functionality only as formed with thin film circuitry on a single substrate surface. Such thin film circuits remain without additional possible circuit functionality and/or structural protection provided on top of the thin film circuit(s).

In light of the various design concerns in the field of electronic components, a need continues to exist for ever smaller electronic components having selected operating characteristics that are also compatible with high volume, low cost assembly methods. While various implementations of passive electronic components and associated features have been developed, no design has emerged that generally encompasses all of the desired characteristics as hereafter presented in accordance with the subject technology.

SUMMARY OF THE INVENTION

In view of the recognized features encountered in the prior art and addressed by the present subject matter, an improved apparatus and methodology for providing thin film surface mount components has been developed.

In some exemplary configurations, a thin film component has been developed that provides for surface mount type terminations without the need for vias, wire bonding, castellation, solder balls, and the like.

In some exemplary configurations, thin film circuits within a surface mount component may include one or more of a variety of different passive components, including resistors, capacitors, inductors, arrays of one or more passive components, networks or filters of multiple passive components and the like. Regardless of the type of thin film circuit(s) employed, such thin film circuit(s) can be sandwiched between first and second insulating substrates with internal conductive pads being exposed between the substrates on end and/or side surfaces of the surface mount component. The exposed conductive pads are then electrically connected to external terminations which provide a surface mount configuration for the components. The external terminations may include a variety of different materials, including at least one layer of conductive polymer and may be formed as termination stripes, end caps or the like. Optional electrical shield layers may also be provided on top and/or bottom device surfaces to protect the surface mount components from signal interference. Regardless of the type of thin film circuit(s) employed, such thin film circuit(s) can be sandwiched between particularly configured, insulating base and cover substrates which may be permanently adhered to one another.

In some exemplary configurations, a thin film component is provided with plated termination features that may be formed using batch plating processes, thus substantially lowering termination costs associated with such devices.

In some exemplary configurations, a thin film component is provided with one or more multilayer cover substrates that includes enhanced circuit functionality, in the form of additional circuitry, capacitive elements, protective functionality or other features.

In some exemplary configurations, thin film circuits within a surface mount component may include one or more of a variety of different passive components, including resistors, capacitors, inductors, arrays of one or more passive components, networks or filters of multiple passive components and the like.

In one particular exemplary embodiment, a surface mount component includes a first thin film circuit, at least first and second conductive pads, first and second substrates and first and second external terminations. The thin film circuit is formed on a surface with the first and second conductive pads forming electrical connections to the thin film circuit An adhesive layer (and other optional sealant layers) are included to adhere the second substrate over the thin film circuit. The stacked arrangement of first and second substrates and interleaved thin film circuit is configured such that the first and second conductive pads extend to and are exposed along one or more end and/or side surfaces of the component. At least first and second external terminations are formed on peripheral surfaces of the component over the exposed portions of the at least first and second conductive pads. Some of the external terminations may optionally include at least one layer of termination material comprising a conductive polymer. Optional shield layers may also be included on top and/or bottom peripheral surfaces of the first and second substrates.

In another particular exemplary embodiment, a surface mount component includes first and second thin film circuits, at least first and second conductive pads, first and second substrates and at least first and second external terminations. The first thin film circuit is formed on a surface of the first substrate, and the second thin film circuit is formed on a surface of the second substrate or on the opposite surface of the first substrate. The first and second conductive pads form electrical connections to the first and second thin film circuits, or separate sets of conductive pads may be provided for each first and second thin film circuit. An insulating adhesive layer (and other optional sealant layers) may be included between the first and second thin film circuits. The stacked arrangement of first and second substrates, and first and second interleaved thin film circuits separated by an insulating layer are configured such that the first and second conductive pads (and any other conductive pads) extend to and are exposed along one or more end and/or side surfaces of the component. At least first and second external terminations are formed on peripheral surfaces of the component over the exposed portions of the at least first and second conductive pads. Some of the external terminations may optionally include at least one layer of termination material comprising a conductive polymer. Optional shield layers may also be included on top and/or bottom peripheral surfaces of the first and second substrates.

In accordance with certain aspects of other embodiments of the present subject matter, methodologies have been developed for making the subject surface mount component. In one exemplary embodiment, a plurality of thin film circuits are formed on a first substrate (e.g. a wafer of insulating material such as alumina, silica or the like). At least first and second conductive pads for each thin film circuit are formed to provide electrical connections for each thin film circuit. A second substrate is then positioned (with or without additional circuitry) on top of the thin film circuits. The second substrate may be adhered over the circuits by a sealant layer, passivation layer, adhesive layer, or combination of such layers. Once thin film circuitry is sandwiched between the first and second substrates, an optional grinding step involves back grinding the outer surface of one or both substrates to reduce the thickness of the substrates to the same or different reduced thicknesses.

Optional first and second shield layers may be provided on one or more outer surfaces of the first and second substrates. Once an entire sandwiched wafer of components is prepared, the assembly is then diced by forming a plurality of orthogonal channels to yield a plurality of discrete surface mount passive components. The dicing may be such that each discrete component includes at least one thin film circuit having a portion of at least first and second conductive pads that are exposed along one or more surfaces of the discrete component. External terminations may then be formed on each discrete component over the exposed portions of the at least first and second conductive pads.

In one exemplary embodiment, a thin film surface mount component includes a base substrate, one or more thin film circuits and conductive pads, an adhesive layer, a cover substrate and external terminations. The base substrate may correspond to a layer of insulating material, such as but not limited to alumina, silicon or the like. The one or more thin film circuits as well as corresponding conductive pads may be formed on a surface of the base substrate. The conductive pads provide electrical connection to the thin film circuit. In addition, the conductive pads extend to and are initially exposed along one or more surfaces of the resultant component. The cover substrate may include insulating material that is formed in multiple layers with a plurality of internal conductive elements e.g., internal active electrodes and/or internal anchor electrodes) and optional external conductive elements that are designed to be generally aligned with the conductive pads formed on the base substrate such that conductive element portions are exposed in groups along one or more peripheral surfaces of the component. The base substrate and/or cover substrate may be back grinded during the manufacturing process to create a desired device thickness. Discrete components are then subject to a plating process to form plated terminations directly to the exposed portions of the conductive elements (including conductive pads, internal active electrodes, internal anchor electrodes, and/or external anchor electrodes).

In accordance with certain aspects of other embodiments of the present subject matter, methodologies have been developed for making the subject surface mount components. In one exemplary embodiment, a plurality of thin film circuits and corresponding conductive pads are formed on abuse substrate wafer (e.g. a wafer of insulating material such as alumina, silica or the like). At least first and second conductive pads for each thin film circuit are formed to provide electrical connections for each thin film circuit. A passivation layer may be applied over the thin film circuits and conductive pads for electrical insulation. A cover substrate block may be formed using multilayer ceramic processing techniques and diced to form multiple cover substrate portions which are respectively fired. One or more cover substrate portions may be bonded to a carrier substrate with a temporary adhesive such that the exposed surface of the cover substrate portion may be optionally grinded if desired. The grinded surface of the cover substrate portion is then laminated to the base substrate wafer using a thin layer of permanent adhesive. The outer surface of the base substrate wafer may then optionally be grinded before the laminated stack is diced into a plurality of discrete devices. Optional corner rounding may be performed as a batch process to prepare the devices for termination. Direct termination plating may involve complete immersion of the devices in electrolytic or electroless plating solutions such that conductive termination material forms by controlled lateral spreading across exposed portions of the internal and external conductive elements.

One present exemplary embodiment relates to a surface mount component, comprising at least one thin film circuit device received between first and second insulating substrates; first and second internal conductive pads, received on one of such insulating substrates and exposed to an external surface of such surface mount component; and first and second electrical connectors connecting such pads with such thin film circuit device.

Some variations of such surface mount component may further include external terminations supported on such surface mount component, and directly electrically connected with such pads. In further alternatives thereof, such external terminations may be on multiple sides of such surface mount component.

Other present variations may further include respective shield layers formed on exposed surfaces of such insulating substrates.

Per others, such one insulating substrate receiving such pads may comprise abase substrate and the other of such insulating substrates comprises a cover substrate; and such cover substrate may comprise a multilayer ceramic-based component. For some of such others, such cover substrate multilayer component may include at least one of internal and external anchor electrodes.

Yet for other present surface mount component variations, such thin film circuit device may comprise a resistive component, or may comprise a capacitor component having at least first and second conductive layers and an intermediate insulative layer, or may comprise an inductive element, or may comprise a multi-component circuit, or may comprise an array of components.

Another present exemplary embodiment of the present subject matter relates to an integrated thin film surface mount electronic component having at least two separate devices. Such embodiment preferably comprises a first thin film circuit device received on a base insulating substrate; an insulating layer received on such first thin film circuit device; a second thin film circuit device received on such insulating layer; a cover insulating substrate received on such second thin film circuit device; at least a pair of internal conductive pads, received on such base insulating substrate and such insulating layer, respectively, and exposed to an external surface of such surface mount electronic component; and at least a pair of electrical connectors, respectively connecting such pair of pads with such thin film circuit device.

Variations of such exemplary integrated thin film surface mount electronic component may further include external terminations supported on such surface mount electronic component, and directly electrically connected with such pads; and with such external terminations situated on multiple sides of such surface mount electronic component.

In other alternatives, such cover substrate may comprise a multilayer ceramic-based component. Further, such cover substrate multilayer component may include at least one of internal and external anchor electrodes.

Per other present variations, such thin film circuit device may comprise one of a resistive component, a capacitor component having at least first and second conductive layers and an intermediate insulative layer, an inductive element, a multi-component circuit, and an array of components.

Yet another present exemplary embodiment relates to an integrated thin film surface mount electronic component, preferably comprising a thin film circuit received on a base insulating substrate and comprising a plurality of arrayed devices; a plurality of paired internal conductive pads, received on such base insulating substrate, respectively associated with such arrayed devices, and exposed to an external surface of such surface mount electronic component; a plurality of paired electrical connectors connecting such pads with their respectively associated arrayed devices; a cover insulating substrate received on such thin film circuit, and external terminations supported on such surface mount electronic component, and directly electrically connected with such pads.

In some embodiments of the foregoing, such external terminations may be on multiple sides of such surface mount electronic component. In others, such cover substrate may comprise a multilayer ceramic-based component; and such arrayed devices may comprise at least one of resistive, capacitive, and inductive subelements. Further, such cover substrate multilayer component may optionally include at least one of internal and external anchor electrodes.

It should be understood by those of ordinary skill in the art that the present subject matter equally relates to apparatus as well as corresponding and/or related methodologies. One present exemplary embodiment relates to a method of forming thin film surface mount components, comprising forming a plurality of thin film circuits on a first insulating substrate; providing respective first and second conductive pads on such first insulating substrate, associated with each of such thin film circuits, and respectively electrically connected thereto; positioning a second insulating substrate over such plurality of thin film circuits, so as to form an intermediate assembly; and selectively dicing such assembly no as to form discrete components, each including at least one thin film circuit and each having at least a portion of such respective first and second conductive pads associated therewith exposed along at least one surface of the respective discrete component.

Present variations of such exemplary method may further include providing an insulating layer over such plurality of thin film circuits with a further plurality of thin films circuits received on such insulating layer, before positioning of such second insulating substrate, so as to form two layers of plural thin film circuits separated by such insulating layer and collectively sandwiched between such first and second insulating substrates.

Per other present variations, such first insulating substrate may comprise abase substrate and such second insulating substrate may comprise a cover substrate. In some such variations, such cover substrate may further include a multilayer structure including internal active capacitor electrodes.

Alternative present methodologies may further include selectively sizing such first and second insulating substrates and/or providing external shield layers on such first and second insulating substrates prior to dicing of such assembly.

Other present alternatives may further include forming external terminations over the exposed portions of such respective first and second conductive pads associated with each of the respective discrete components. For some of such alternatives, such respective discrete components may comprise multisided components and such external terminations may comprise one of two-sided terminations, four-sided terminations, and asymmetrical multi-sided terminations.

In yet other present alternatives, such cover substrate may further include a multilayer structure including at least one of internal and external anchor electrodes; and such alternative present method may further include forming external terminations on each of the respective discrete components, guided by such anchor electrodes.

For still other variations, such thin film circuits may comprise respectively at least one of passive components including resistors, capacitors, and inductors, and/or may comprise respectively arrays of one of passive components, networks and filters.

Yet another present exemplary embodiment for methodology relates to a method of forming thin film surface mount components for mounting on a circuit board, preferably comprising fabricating an array of thin layer circuits on a base substrate wafer; preparing a multilayer ceramic cover substrate; joining such cover substrate with such fabricated array; and dicing the resulting joined structure so as to form singulated structures.

Per present variations of such methodology, such fabricating of such array may include forming a plurality of thin film devices on a first insulating substrate, and providing respective first and second conductive pads on such first insulating substrate, associated with each of such thin film devices, and respectively electrically connected thereto; and such thin film devices respectively may comprise one of respective passive components and arrays of passive components.

Per other present variations, such joining may include applying a passivation layer to a facing surface of such base substrate wafer, and laminating such cover substrate to such base substrate wafer.

In other present variations, such joining may include laminating such cover substrate to such base substrate wafer with at least a portion of such respective first and second conductive pads exposed along at least one surface of the respective diced singulated structures. Some of such variations may further include forming external terminations on such singulated structures over the exposed portions of such respective first and second conductive pads associated with each of the respective diced singulated structures. Per still further alternatives thereof, such respective diced singulated structures may comprise multisided components and such external terminations may comprise one of two-sided terminations, four-sided terminations, and asymmetrical multisided terminations.

Some present alternative methodologies may further include performing corner-rounding on such singulated structures and/or may further include forming external terminations on such singulated structures.

Additional aspects and advantages of the present subject matter are set forth in, or will be apparent to, those of ordinary skill in the art from the detailed description herein. Also, it should be further appreciated that modifications and variations to the specifically illustrated, referred and discussed features, steps and elements hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which:

FIG. 2A provides an exploded perspective view of a third exemplary embodiment of a thin film surface mount electronic component in accordance with aspects of the present technology;

FIG. 2B provides a cross-sectional plan view of the second exemplary embodiment shown in FIG. 2A taken along section lines B-B and illustrated with the addition of external terminations;

FIG. 2C provides a cross-sectional plan view of a fourth exemplary embodiment of a thin film surface mount electronic component, similar to that shown in FIGS. 2A and 2B but without the optional shield layers;

FIG. 3 provides a perspective view of an exemplary thin film surface mount resistor without external terminations in accordance with aspects of the present technology;

FIGS. 4 and 5 provide respective perspective and plan views of an exemplary thin film surface mount resistor such as shown in FIG. 3 with exemplary external terminations;

Figure 1A:
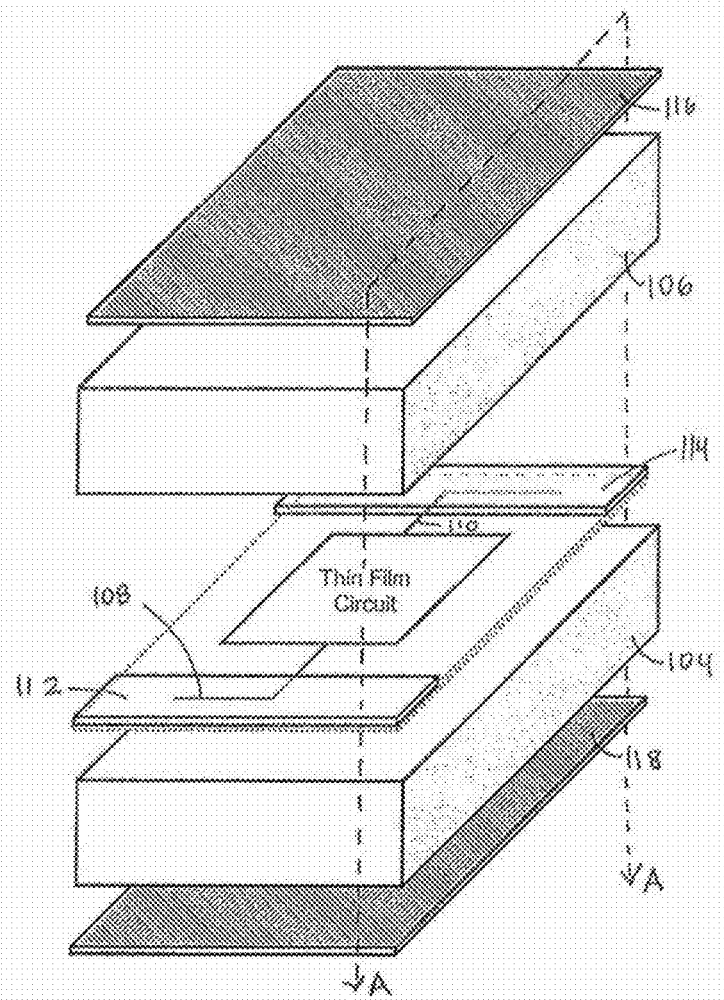
FIG. 1A provides an exploded perspective view of a first exemplary embodiment of a thin film surface mount electronic component in accordance with aspects of the present technology.

Repeat use of reference characters throughout the present specification and appended drawings is intended to represent same or analogous features, elements or steps of the present subject matter.

DETAILED DESCRIPTION OF THE PREFERRED EMBODIMENTS

As discussed in the Summary of the Invention section, the present subject matter is particularly concerned with improved apparatus and methodology for providing thin film surface mount components. Generally speaking, the subject components may correspond to a variety of different circuit types, including passive components such as but not limited to resistors, inductors and capacitors, as well as combinations of such components including filters, arrays and/or networks of components.

The present subject matter is also at least in part concerned with improved apparatus and methodology for providing thin film surface mount components that are compatible with high volume, low cost assembly technologies such as pick-and-place mounting followed by solder reflow.

It is to be understood by one skilled in the art that the present discussion is a description of exemplary embodiments only, and is not intended as limiting the broader aspects of the present subject matter, which broader aspects are embodied in the exemplary construction. Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference will now be made in detail to the presently preferred embodiments of the subject thin film surface mount components. It should be appreciated that the various surface mount components illustrated and discussed herein make reference to discrete components, although such components may be formed either individually or as an array of multiple components that are diced during manufacturing to form multiple discrete components. The illustration of such components primarily in their discrete component representation should not detract from the option to practice aspects of the subject technology in accordance with multiple components or arrays of components.

Figure 15:
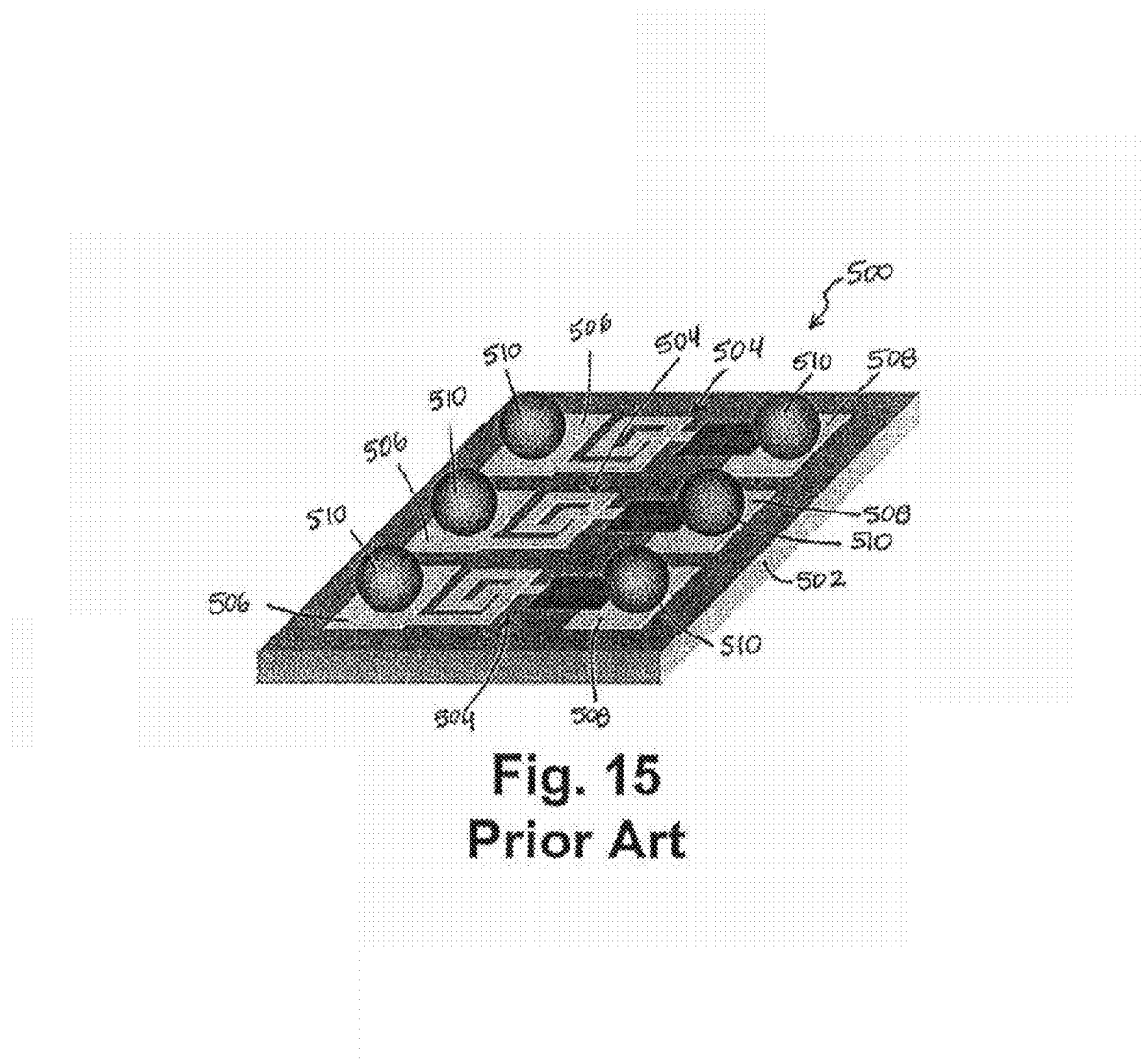
FIG. 15 provides a perspective view of a prior art thin film electronic component having ball-grid-array (BGA) terminations.

In order to better appreciate the various aspects and advantages of the present technology, an exemplary depiction of a known BGA component 500 is shown in FIG. 15. One or more thin film circuits (such as the array of three circuits 504 shown in FIG. 15) is formed on a surface of substrate 502. Respective pairs of first and second contact lands 506 and 508 are also formed on a surface of substrate 502 and used as a mounting location for respective solder balls 510. As shown, the contact lands 506 and 508 as well as the solder balls 510 take up a significant amount of board real estate on substrate 502. In light of this known technology, it will be appreciated by one skilled in the art that various embodiments of the techniques disclosed herein can provide components with improved terminations that can be easily mounted to a surface without requiring sophisticated, expensive and sometimes unpredictably sized mounting features such as wires, solder balls and/or lands.

Figure 1B:
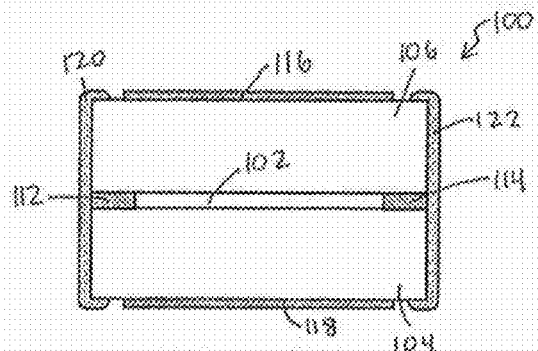
FIG. 1B provides a cross-sectional plan view of the first exemplary embodiment shown in FIG. 1A taken along section lines A-A and illustrated with the addition of external terminations.
Figure 1C:
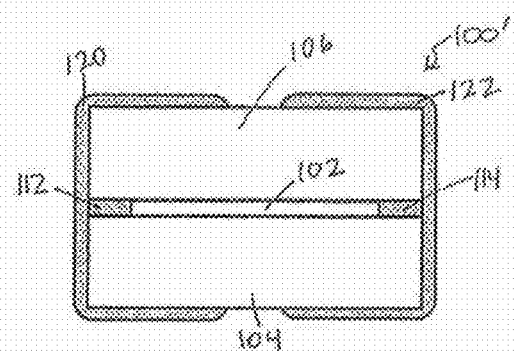
FIG. 1C provides a cross-sectional plan view of a second exemplary embodiment of a thin film surface mount electronic component, similar to that shown in FIGS. 1A and 1B but without the optional shield layers.

Referring now to the drawings, FIGS. 1A-1C respectively illustrate aspects of first and second exemplary surface mount components 100, 100'. Component 100 generally includes at least one thin film circuit 102 provided in between first and second substrates 104 and 106. The thin film circuit 102 may correspond to any single passive component or combination of passive components. For example, thin film circuit 102 may include a single resistor, capacitor or inductor. Thin film circuit 102 may correspond to an array of multiple passive components, such as an array of resistors, capacitors and/or inductors provided in a planar array of one or more rows and columns of such components. Thin film circuit 102 may correspond to a combination or network of components, for example a resistor-capacitor (RC) network, a filter such as a low-pass filter, EMI or RFI filter, or other combination of passive elements. Some specific examples of such components will be illustrated and discussed herein, although it should be appreciated by one of ordinary skill in the art that the potential combinations of such components are endless.

First and second substrates 104 and 106 are preferably made of one or more insulating ceramic or non-ceramic materials, including but not limited to glass, alumina ($Al_2O_3$), aluminum nitride (AlN), beryllium oxide (BeO), gallium arsenide (GaAs), gallium nitride (GaN), indium phosphide, porcelain, quartz, sapphire, silicon (Si), silicon carbide (SiC), silica ($SiO_2$), silicon nitride ($Si_3N_4$), zirconia ($ZrO_2$), oxides and/or nitrides of such materials or any other insulating thin-film material having a generally high thermal resistance. One of the substrates (i.e., first substrate 104) may sometimes be referred to as a base substrate, and the other substrate (i.e., substrate 106) may sometimes be referred to as the cover substrate.

The length and width dimensions of the first and second substrates 104 and 106 may be substantially the same, and the thicknesses of the first and second substrates 104 and 106 may be the same or they may vary. In one embodiment, the thickness of substrates 104 and 106 can be customized by back grinding a substrate wafer before it is diced to form discrete components. Additional aspects of such methodology are discussed later with reference to FIG. 16. In various exemplary embodiments, the thickness of substrates 104 and 106 is between about 0.1-1.0 mm in one embodiment, between about 0.2-0.6 mm in one embodiment, and about 0.5 mm in one embodiment.

Thin film circuit 102 is illustrated in FIG. 1A as a separate layer, although it should be appreciated that thin film circuit 102 may actually be formed directly on a surface of the first (base) substrate 104. When thin film circuit 102 is formed directly on a surface of substrate 104, it may consist of multiple layers of conductive materials, dielectric materials, resistive materials, inductive materials, or other materials that are precisely formed using "thin film" technology. For example, the respective layer(s) of materials forming thin film circuit 102 may be applied using specialized techniques based on etching, photolithography, PECVD (Plasma Enhanced Chemical Vapor Deposition) processing or other techniques.

At least first and second electrical connectors 108 and 110 may be provided as an integral part of thin film circuit 102 or as separately formed elements of component 100. At least one of the at least first and second electrical connectors (e.g., connector 108) serves as a first (+) polarity connection to the thin film circuit 102 while at least one of the first and second electrical connectors (e.g., connector 110) serves as a second (-) polarity connection to the thin film circuit. Electrical connectors 108 and 110 may correspond to conductive traces, metalized layers or the like.

First and second conductive pads 112 and 114 are also provided on the surface of base substrate 104. Conductive pads 112 and 114 are electrically connected to the at least first and second electrical connectors 108 and 110 for the thin film circuit 102. Conductive pads 112, 114 may be formed of a material such as copper, gold, platinum, nickel, silver, palladium or other conductive metals or alloys of such metals. The thickness of conductive pads 112 may be within a range from between about 1-50 microns in one embodiment, and between about 5-20 microns in another embodiment. Conductive pads 112, 114 are also positioned such that they will be exposed along one or more peripheral surfaces of component 100 when the various device layers are stacked together. For example, conductive pads 112 and 114 in FIGS. 1A-1C respectively extend to and are exposed along an entire end surface of the device and along parts of two adjacent side surfaces. The thickness and exposure location of conductive pads 112, 114 is important to help create a bonding and connection surface for attaching to external terminations and thus implementing a surface mount termination structure in accordance with aspects of the disclosed technology.

After the respective layers forming the components within thin film circuit 102 and optionally the connectors 108, 110 and conductive pads 112, 114 are formed on first substrate 104, one or more optional sealing layers (not illustrated) may be provided over the entire circuitry. Such sealing layer may provide protection for the circuitry as well as adhesive bonding to the second substrate 106. For example, one embodiment of a sealing layer includes a first passivation layer of a material such as benzocyclobutene (BCB) or a polyimide, polymer or other inorganic or organic material and a second material corresponding to an adhesive material such as an epoxy glue, resin, or other natural or synthetic adhesive such as an elastomer, thermoplastic, emulsion, polyvinyl acetate, epoxy, polyurethane, cyanoacrylate polymers, other polymers and others.

With or without an additional sealing layer, the thin film circuit 102 and related components are sandwiched between first and second substrates 104 and 106. Optional shield layers 116 and 118 may further be provided, if desired, on the top and/or bottom surfaces of the component assembly 100. Shield layers 116, 118 may correspond to layers of conductive metals such as but not limited to copper, gold, platinum, nickel, silver, palladium or other conductive metals or alloys of such metals. Shield layers 116 and 118 may be formed to substantially cover outer surfaces of the first and second substrates 104 and 106, or may be formed with a generally smaller size or with cutouts to provide locations for external terminations to wrap around to top and/or bottom component surfaces without shorting the electronic component by electrically connecting to the shield layers. Shield layers 116 and 118 may also be attached to the first and second substrates 104, 106 with an adhesive material such as epoxy glue or resin or any of the other exemplary materials mentioned above for an adhesive layer.

FIG. 1B shows an exemplary cross-sectional view of the component 100 shown in exploded view in FIG. 1A, taken along section lines A-A. As shown, first and second external terminations 120 and 122 are formed on the periphery of component 100 and are in direct electrical connection with respective conductive pads 112 and 114. The first and second external terminations 120 and 122 may be formed only on given end surfaces of assembly 100, or may wrap around to top and/or bottom surfaces of the assembly 100 as shown in FIG. 1C. As previously mentioned, the location of external terminations 120 and 122 is preferably designed such that terminations 120 and 122 are not in direct contact with optional shield layers 116 and 118. Additional portions or layers of insulating material may be provided on the periphery of component 100 to help ensure the electrical separation of such conductive elements.

FIG. 1C shows an exemplary cross-sectional view of a component 100', similar to those shown in FIGS. 1A and 1B, but without optional shield layers 116 and 118. In such configuration, the location of external terminations 120 and 122 on top and/or bottom surfaces can extend further towards one another along top and/or bottom device surfaces.

External terminations 120 and 122 (and other external terminations disclosed herein) can include one or more layers of the same or different materials formed in using the same or different methods of application. For example, external terminations 120 and 122 may correspond to one or more layers of thin-film or thick-film conductive materials applied by selected formation techniques, including but not limited to printing, dipping, striping, or other techniques for forming conductive layers. Different types of conductive materials may be used, for example, an initial thick-film layer of conductive paste over which additional thin-film layers of plating (e.g., nickel, copper, tin, gold, etc.) may be provided.

In one exemplary embodiment, external terminations respectively include at least one organometallic layer, e.g., a layer of conductive polymer material to provide flexibility in the external terminations. Use of such material can help ensure electrical integrity is maintained during and after external forces such as mechanical or thermo-mechanical stresses are applied to a component. In one exemplary embodiment, such a conductive polymer corresponds to a polymer, resin, epoxy, polyamide, thermoset, thermoplastic, or other polymer material loaded with conductive metal particles such as but not limited to silver, nickel, aluminum, platinum, copper, palladium, gold, alloys of such materials or others. In some particular embodiments, such a conductive polymer is chosen to be a low temperature material such that the curing temperature is less than the curing temperature of other materials in the component, such as the adhesive or sealant layers. In addition, the conductive polymer material may be chosen such that it is capable of withstanding certain reflow temperatures in a circuit mounting environment. In one embodiment, the conductive polymer termination material is applied over a base layer of conductive metal such as copper, nickel or the like. In another embodiment, the conductive polymer termination layer is provided directly to the peripheral component surfaces such that the conductive polymer termination layer is in direct electrical connection with exposed portions of the internal conductive pads of a component. Still further, additional termination layers may be formed over the layer of conductive polymer termination material. For example, one or more layers of plated nickel, copper or tin may be provided over the layer of conductive polymer termination material.

The resultant components 100 and 100' shown in FIGS. 1A-1C and other components disclosed herein are advantageous thin film devices because they are formed as chip components that can be easily mounted to a surface without requiring sophisticated mounting features such as wires, solder balls and/or lands. Components 100 and 100' are generally symmetrical and orientation insensitive such that they can be mounted on either top and/or bottom surfaces and provide the same functionality. The direct connection between external terminations 120, 122 and the conductive pads 112, 114 which are part of the internal electrical connections for thin film circuit 102 are simple and direct, thus yielding desirably low levels of equivalent series inductance (ESL) that may be contributed by the termination structures.

Additional exemplary surface mount component embodiments 200 and 200' constructed in accordance with aspects of the presently disclosed technology are illustrated in FIGS. 2A-2C. As shown in such figures, components 200 and 200' are similar in many respects to components 100 and 100' of FIGS. 1A-1C and like reference numerals are used to refer to the same or similar features. In components 200 and 200', two different thin film circuits are formed as part of the surface mount components. A first thin film circuit 102 is formed on a surface of the first substrate 104 (i.e., the upper surface of substrate 104 as shown in FIG. 2A). A second thin film circuit 132 is also provided and is formed on a surface of the second substrate 106 (i.e., the lower surface of substrate 106 as shown in FIG. 2A).

Second thin film circuit 132 is also formed with respective electrical connections and conductive pads, similar to those provided with first thin film circuit 102. More particularly, third and fourth electrical connections 134 and 136 (similar to first and second electrical connections 108 and 110) are formed as an integral part of thin film circuit 132 or as separately formed elements of component 200. Third and fourth conductive pads 138 and 140 are also provided on the surface of substrate 106 to serve as electrical connections to thin film circuit 132 and interfaces to external terminations for component 200. The particular materials, arrangement and size of conductive pads 138 and 140 may be similar to that previously described relative to conductive pads 112 and 114. In particular, third and fourth conductive pads 138 and 140 may be positioned such that they will be exposed along one or more peripheral surfaces of component 200 when the various device layers are stacked together, similar to the exposure location of conductive pads 112 and 114. As such, the thickness and exposure location of all conductive pads 112, 114, 138 and 140 along one or more surfaces (e.g., along an entire end surface and parts of two adjacent side surfaces as shown in FIGS. 2A-2C) helps create a bonding and connection surface for attaching to external terminations and thus implementing a surface mount termination structure in accordance with aspects of the disclosed technology.

Referring still to FIGS. 2A-2C, an insulating layer 142 separates the first and second thin film circuits 102 and 132 and their respective electrical connections. Insulating layer 142 may correspond to one or more layers of the same or different materials such as previously described regarding an optional sealing layer. In one example, insulating layer 142 corresponds to an insulative adhesive such as nonconductive epoxy, resin or the like.

In an alternative to the arrangement shown in FIGS. 2A-2C, only a single set of conductive pads is used for providing the electrical connection to both first and second thin film circuits 102 and 132. In such embodiment, the insulating layer 142 may be formed to only cover the thin film circuits 102 and 132 on the opposing substrates 104 and 106 and leave the area forming a single set of conductive pads exposed so as to electrically connect both thin film circuits in parallel or series configurations, depending on the desired connection arrangement.

FIG. 2B shows an exemplary cross-sectional view of the component 200 shown in exploded view in FIG. 2A, as taken along section lines B-B. As shown, first and second external terminations 120 and 122 are formed on the periphery of component 200 and are in direct electrical connection with respective conductive pads 112, 114, 138 and 140. The first and second external terminations 120 and 122 may be formed only on given end surfaces of assembly 200, or may wrap around to top and/or bottom surfaces of the assembly 200 as shown in FIGS. 2B and 2C. As previously mentioned, the location of external terminations 120 and 122 is preferably designed such that terminations 120 and 122 are not in direct contact with optional shield layers 116 and 118. Additional portions or layers of insulating material may be provided on the periphery of component 200 to help ensure the electrical separation of such conductive elements.

FIG. 2C shows an exemplary cross-sectional view of a component 200', similar to those shown in FIGS. 2A and 2B, but without optional shield layers 116 and 118. In such configuration, the location of external terminations 120 and 122 on top and/or bottom surfaces can extend further towards one another along top and/or bottom device surfaces.

It should be appreciated that the overall size of components 100, 100', 200, 200' and other components described herein may be customized depending on desired performance parameters. In some examples herein, exemplary dimensions of overall device sizes are described as component sizes of "XXYY" corresponding to one having a width dimension of 0.XX inches and a length dimension of 0.YY inches. For example, some devices may have exemplary dimensions corresponding to 0201, 0402, 0603, 0805, 1206, or other component sizes. In an 0201 size device corresponding to length of width dimensions of about 0.02 inches by 0.01 inches or about 500 microns by about 250 microns), the conductive pads 112 and 114 may be formed to be about 250 microns across the end of component 300 and between about 10-50 microns or about 20-30 microns along the adjacent sides of component 300. Exemplary thicknesses of the devices disclosed herein, including both first and second substrates and interleaved thin film circuit(s) may be between about 0.2-2.0 mm in one embodiment or between about 0.5-1.0 mm in another embodiment. It should be appreciated that such dimensions are presented as examples only and should not unnecessarily limit the broad application of principles of the disclosed technology.

Figure 8:
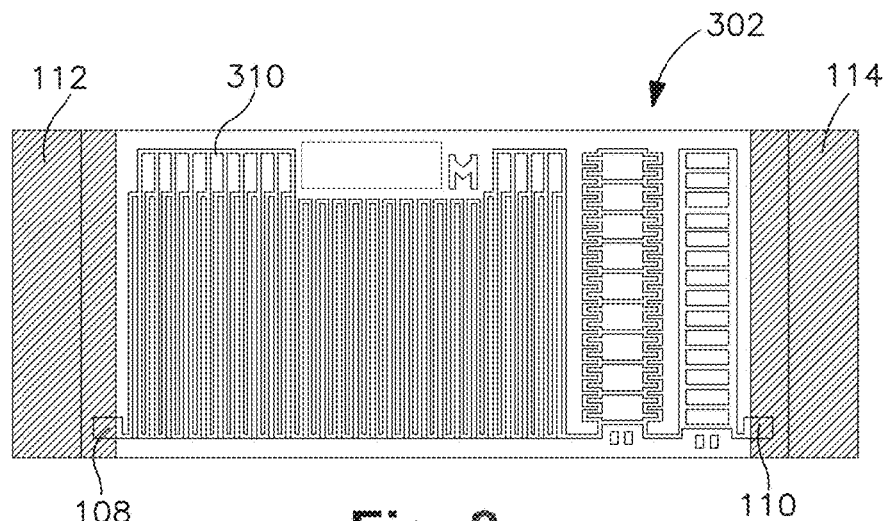
FIG. 8 provides a plan view of an exemplary thin film circuit for use in a resistive component in accordance with aspects of the present technology.

FIGS. 3-5 illustrate another exemplary embodiment of the present technology, particularly a thin film surface mount resistor 300. Resistor 300 includes first and second substrates 104 and 106 as previously described, and the thin film circuit 102 sandwiched in between such substrates corresponds to a thin film precision resistor 302. First and second conductive pads 112 and 114 serves as the electrical connections to thin film resistor 302 and are exposed along respective end and side surfaces of the component 300 such that they can be in direct electrical connection with external terminations 320 and 322 (which may include one or more attributes of previously described external terminations 120 and 122). The conductive pads 112 and 114 are formed over first and second electrical connections 108, 110 within the thin film resistor 302 as shown in FIG. 8. The exemplary embodiment shown in FIGS. 3-5 does not illustrate the optional shield layers as previously described, although one of ordinary skill in the art will appreciated that such layers may be included in other embodiments.

Referring more particularly to FIG. 8, an exemplary configuration for a thin film precision resistor is shown. A pattern 310 of resistive material is produced on a substrate surface (e.g., on the upper surface of substrate 104) by photolithography or other suitable patterning technique. Pattern 310 may correspond to a selectively applied film of resistive material, such as hut not limited to tantalum nitride (TaN), nickel chromium (NiCr), tantalum aluminide, chromium silicon, oxides and/or nitrides of such materials or others, or other suitable thin film resistive materials). Some or all of pattern 310 may be formed as an arrangement of multiple parallel paths (e.g., a serpentine path) that is formed with predetermined spacing between each parallel path portion to help define a desired level of overall resistance. For example, a 2 MΩ resistor (0.2-2.2 MΩ) may be formed using a 4 μm line width for the resistive path portions as shown. A 4 MΩ, resistor (2.0-4.3 MΩ) may be formed using a 3 μm line width for the resistive path portions as shown. An 8 MΩ resistor (3.0-8.5 MΩ) may be formed using a 2 μm line width for the resistive path portions as shown.

Figure 6:
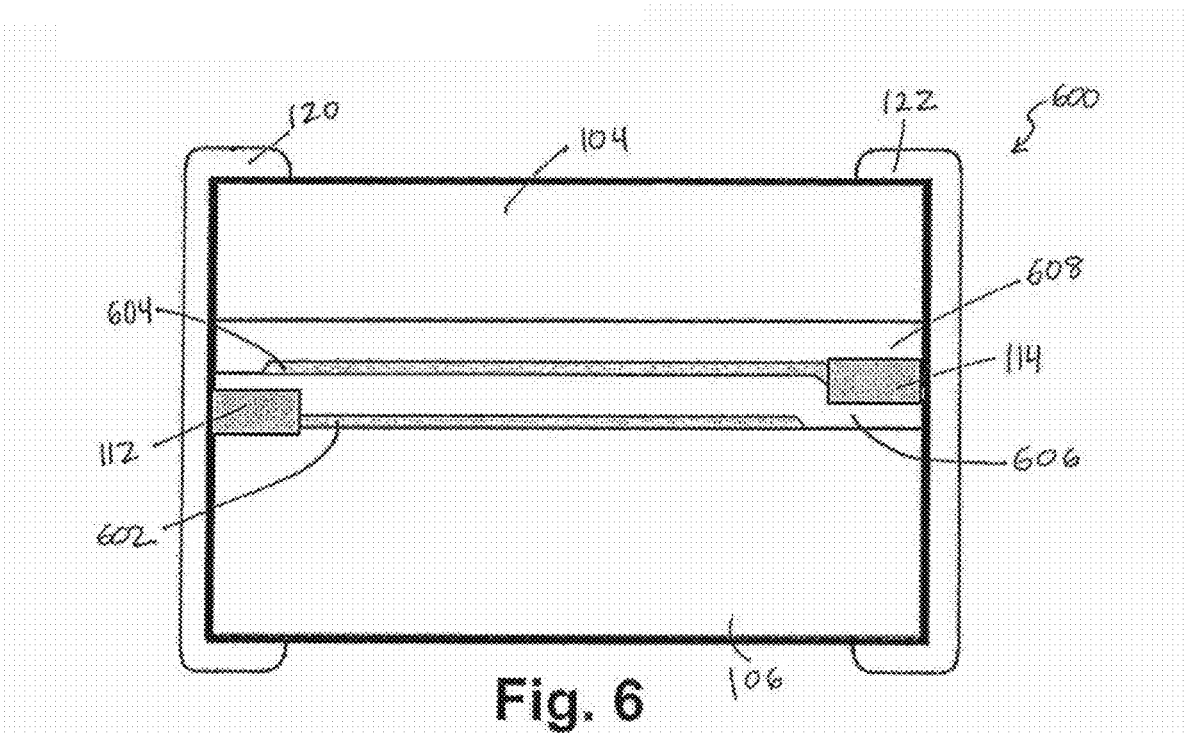
FIG. 6 provides a cross-sectional view of an exemplary thin film surface mount capacitor in accordance with aspects of the present technology.

Another exemplary embodiment of the present technology is shown in FIG. 6, which is particularly directed to a thin film surface mount capacitor 600. Such example describes how a thin-film circuit 102, 132 as previously mentioned may be formed as a thin film capacitor. In FIG. 6, a thin film circuit formed between first and second substrates 104 and 106 includes first and second conductive electrode layers 602 and 604 and an interleaved dielectric layer 606. Conductive layer 602 forms the bottom plate and conductive layer 604 forms the top plate of a parallel-plate capacitor. Different materials known to those of ordinary skill in the art may be selected for forming the electrodes and dielectric material of the subject capacitors. For example, electrodes 602 and 604 may be formed of a variety of different conductive materials, such as but not limited to aluminum, platinum, silver, nickel, copper, palladium, gold, alloys of such materials, multiple layers of combinations of such materials and/or other suitable conductive substances. Dielectric material 606 may comprise a high-K dielectric to achieve a relatively large capacitance value while requiring only a single layer of dielectric material and often a generally small plate area. For example, it may be desirable to utilize a dielectric material exhibiting a dielectric constant of greater than approximately 100, greater than approximately 500, or as high as 10,000 or more in various exemplary embodiments. Specific exemplary materials for use in dielectric layer 606 may include but are not limited to silicon oxynitride, silicon nitride, silicon oxide, barium titanate, strontium titanate, strontium barium titanate, bismuth strontium tantalate, tantalum, niobium, oxides or nitrides or such materials, NPO (COG), X7R, X7S, Z5U, Y5V formulations, lead-based materials such as doped or non-doped PZT dielectrics, and others.

Referring still to FIG. 6, first conductive pad 112 is formed to be electrically connected to the first electrode 602 and also to first external electrode 120. Second conductive pad 114 is formed to be electrically connected to the second electrode 604 and also to second external electrode 122. A sealant layer 608 (such as previously discussed with reference to FIG. 1) is also included to cover and protect the thin film capacitor. The device as illustrated does not include shield cover layers, but could be modified to do so.

Figure 7:
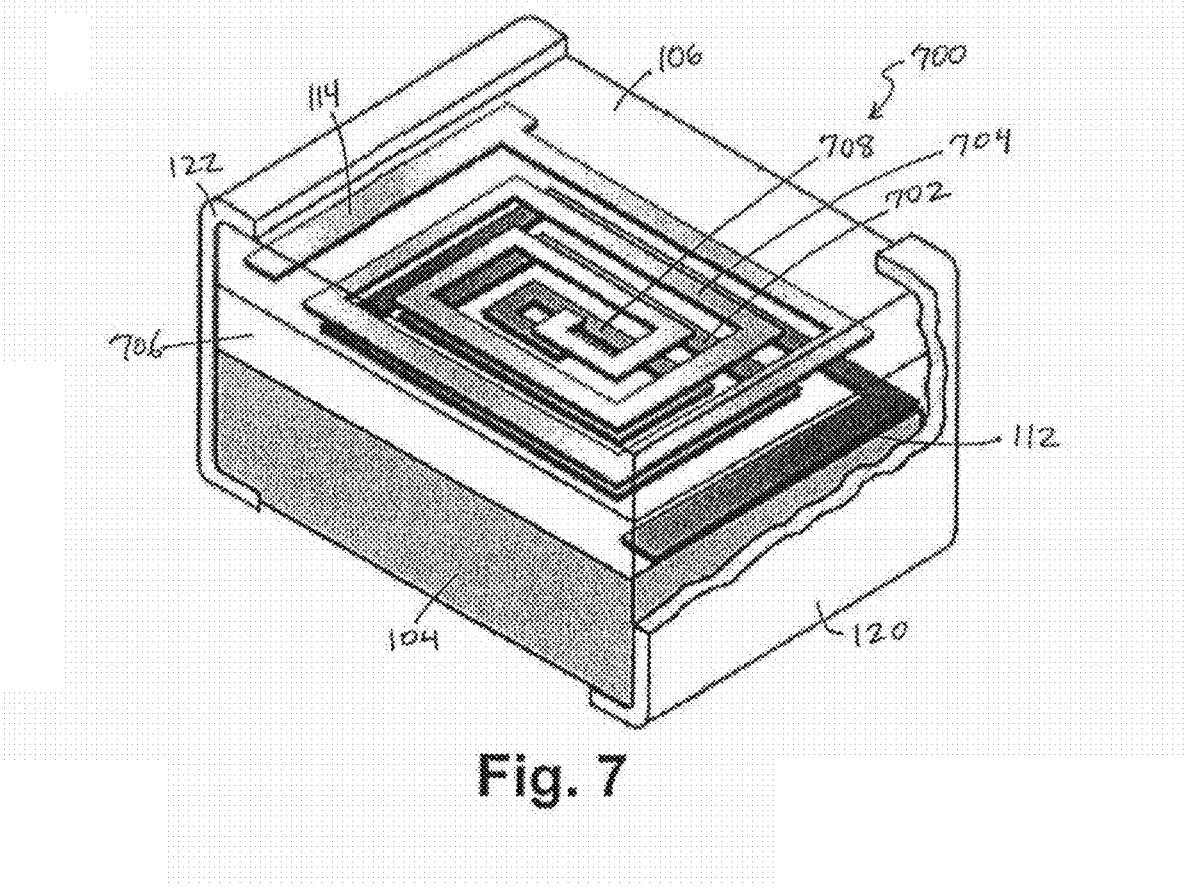
FIG. 7 provides a perspective view of an exemplary thin film surface mount inductor in accordance with aspects of the present technology having external terminations shown in partial cutaway form.

Another exemplary embodiment of the present technology is shown in FIG. 7, which is particularly directed to a thin film surface mount inductor 700. Such example describes how a thin-film circuit 102, 132 as previously mentioned may be formed as a thin film inductor. In FIG. 7, a thin film circuit formed between first and second substrates 104 and 106 generally includes first and second conductive layers and an intermediate insulative layer 706. A first conductive layer is formed to define a first conductive spiral 702 as well as first conductive pad 112. The second conductive layer is formed to define a second conductive spiral 704 as well as second conductive pad 114. First conductive pad 112 is formed to be electrically connected to the first external electrode 120, while second conductive pad 114 is formed to be electrically connected to the second external electrode 122. External electrode 120 is shown in a partially cutaway representation. Insulative layer 706 may be formed to define a via or opening 708 therethrough to connect the first and second conductive spirals 702 and 704. Various sealant layers, or shield layers as previously described may also be included, although are not illustrated. The materials forming the conductive and insulating layers in component 700 may be similar to those described with reference to previous embodiments, especially relative to capacitor 600 in FIG. 6. Device dimensions may also be as disclosed, and in one example, each substrate 104 and 106 is about 0.3 mm and the total device thickness (substrates plus inductor layers) is between about 0.8-1.0 mm. Inductance may be achieved on levels of between about The exemplary embodiments shown in FIGS. 3-8 are directed to respective single passive components (e.g., a resistor, capacitor and inductor) formed in accordance with aspects of the presently disclosed technology. It should be appreciated that additional components formed in accordance with the disclosed technology may include arrays of one or more passive components, such as resistor arrays, capacitor arrays and/or inductor arrays. In addition, networks of devices may be formed, such as resistor-capacitor networks, an example of which is disclosed in U.S. Pat. No. 6,285,542 (Kennedy, III et al.) assigned to AVX Corporation which is incorporated by reference herein for all purposes. Networks and/or filters of multiple passive components may include endless combinations of elements. One particular example is illustrated in and discussed with reference to FIGS. 9-14.

Figure 9:
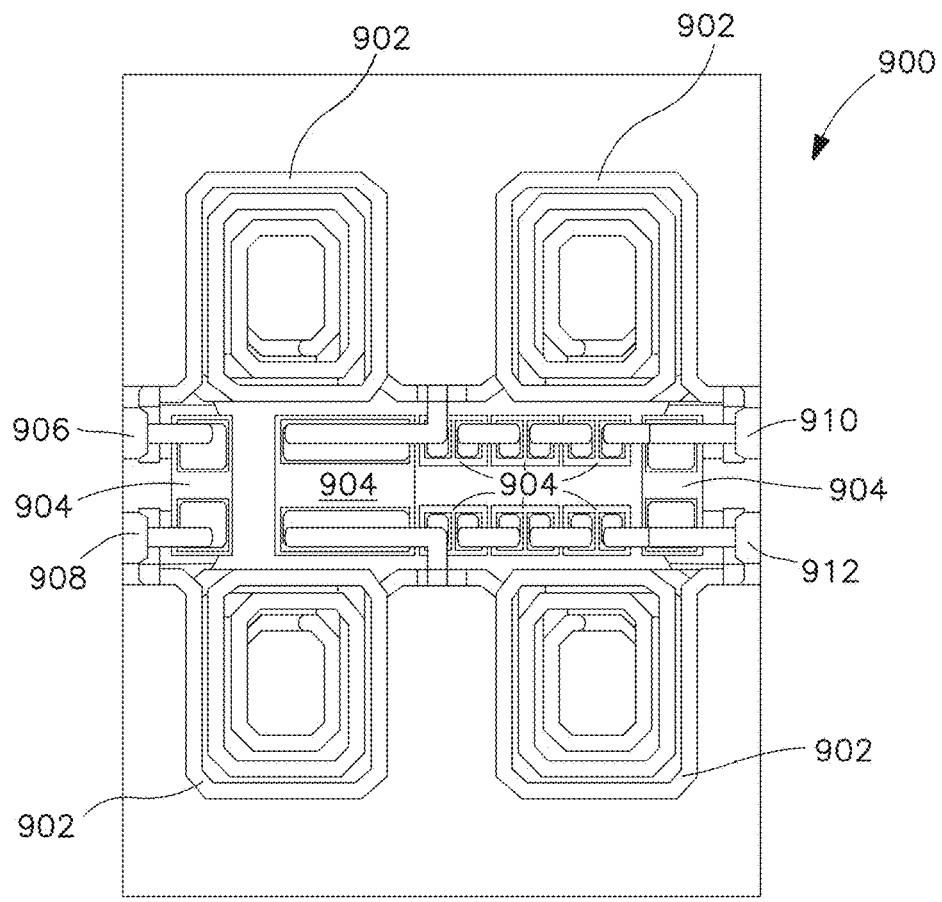
FIG. 9 provides a plan view of an exemplary thin film circuit for use in a filter component accordance with aspects of the present technology.

Referring now to FIG. 9, an exemplary differential low pass filter (LPF) 900 for use in high frequency applications includes multiple inductors and capacitors in a thin film circuit. For example, four inductors 902 are formed using the technique described with reference to FIG. 7 such that each inductor 902 includes separate layers of conductive spirals separated by an insulating layer. The multiple turns in each conductive spiral may be isolated from one another by additional insulation such as provided by BCB insulation formed between the turns. Multiple capacitors 904 are formed as parallel plate capacitors and variously connected to the inductors 902 to form a desired filter circuit configuration. First and second conductive pads 906 and 908 provide first and second electrical connections to the various components within thin film filter circuit 900 that extend to and are exposed on a first side surface of a device. Third and fourth conductive pads 910 and 912 provide third and fourth electrical connections to various components within thin film circuit 900 that extend to and are exposed on an opposing side surface of the device. In one embodiment, conductive pads 906 and 908 serve as respective inputs for the thin film filter 900 while third and fourth conductive pads 910 and 912 serve as respective outputs for the thin film filter 900.

Figure 10:
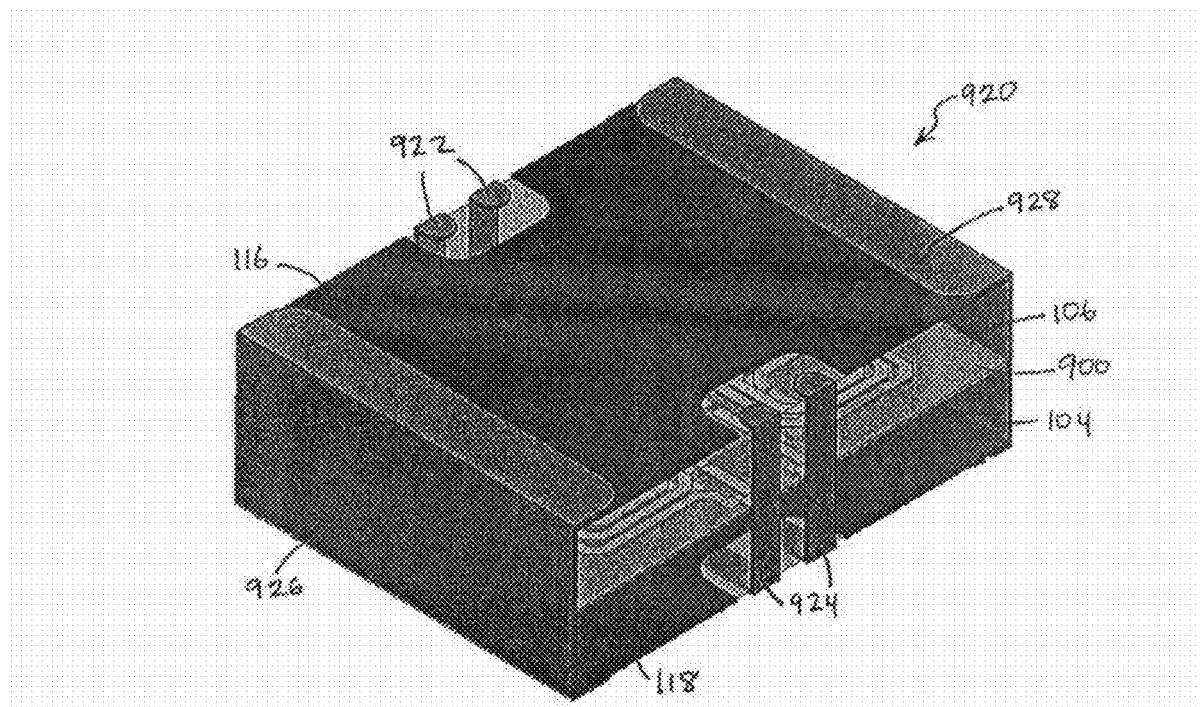
FIG. 10 provides a perspective view of an exemplary embodiment of a thin film filter component having a first exemplary set of external terminations in accordance with aspects of the present technology.
Figure 11:
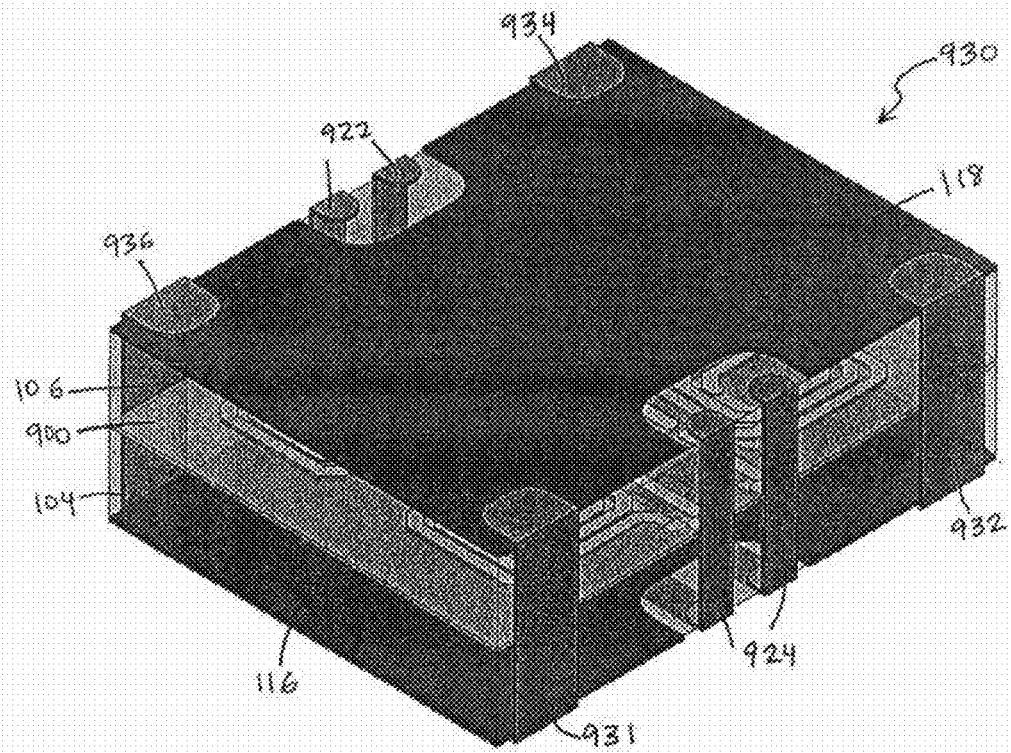
FIG. 11 provides a perspective view of an exemplary embodiment of a thin film filter component having a second exemplary set of external terminations in accordance with aspects of the present technology.

The filter circuit 900 shown in FIG. 9 may be included as one or more thin film circuits within a surface mount component. As shown in FIGS. 10 and 11, components 920 and 930 respectively include a thin film filter circuit 900 as shown in FIG. 9 sandwiched between two substrates 104 and 106 using adhesive such as epoxy or the like. First and second external terminations 922 provide input ports for the filter 900 and are electrically connected to the first and second conductive pads 906 and 908. Third and fourth external terminations 924 provide output ports for the filter 900 and are electrically connected to the third and fourth conductive pads 910 and 912. Specific positioning of the external terminations 922 and 924 allows for accurate control of the characteristic impedance at the input and output ports. First and second shield layers 116 and 118 provide circuit protection from signal interference.

Additional external terminations may be provided to serve as ground connections for the components 920 and 930 in FIGS. 10 and 11. In FIG. 10, additional external terminations 926 and 928 substantially cover the entire end surface of component 920, and are connected to the shield layers 116 and 118. Terminations 926 and 928 provide ground connections for the component 920 and offer additional shielding on the device ends (similar to the shielding afforded by layers 116 and 118). In one specific example, the width of each input and output termination 922, 924 is about 100-500 microns and the pitch between such terminations on a given side is between about 300-800 microns. In FIG. 11, additional external terminations 931, 932, 934 and 936 are coupled to the shield layers 116 and 118 and serve as ground connections on side surfaces of the component 930. As appreciated from FIGS. 10 and 11, the location of external ground terminations can vary in number and placement along the ends and/or sides of the surface mount components.

Figure 12:
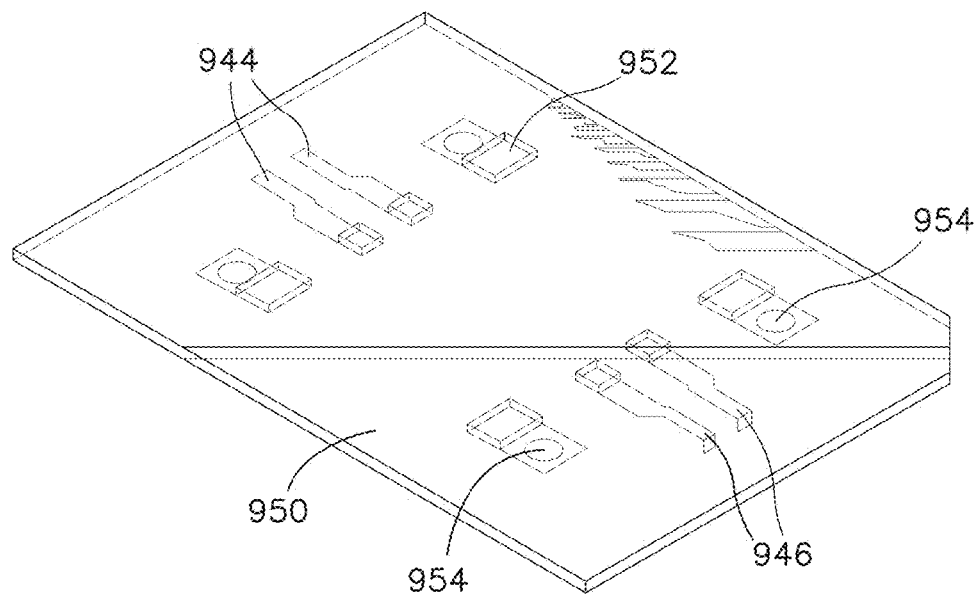
FIG. 12 provides a perspective view of an exemplary circuit board configured to serve as a mounting environment for thin film surface mount structures in accordance with the present technology.
Figure 13:
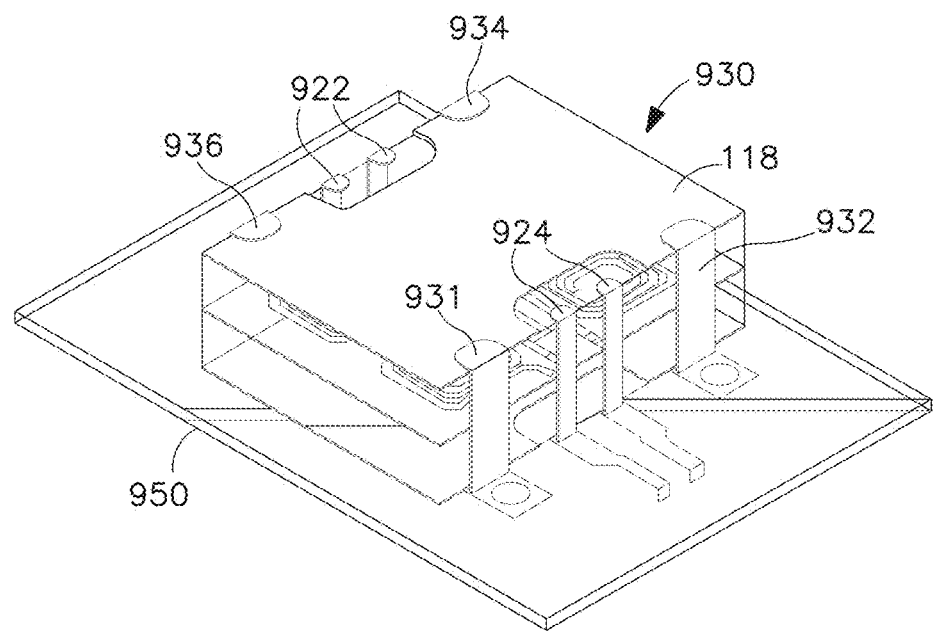
FIG. 13 provides a perspective view of a thin film surface mount filter component mounted to a circuit board in accordance with an aspect of the present technology.

The design features of the external terminations of a component (e.g., the size and location of such terminations) may determine how a component is mounted to a circuit board or other environment. An example of a circuit board 950 and associated mounting pad structure is shown in FIGS. 12 and 13 for the exemplary component 930 of FIG. 11. Solder pads 952 are provided for each external termination of component 930 (e.g., terminations 922, 924, 930, 931, 932, 934 and 936) that are capable of reflowed mounting to the circuit board environment. Input board pads 944 and output board pads 946 may be provided for making electrical connection to other components in a circuit environment. In some embodiments, input and output board pads 944 and 946 may be configured with precise spacing to form differential transmission lines for matching desired impedance levels for component 500. Ground board pads 954 are also provided for making electrical connection to other components in a circuit environment.

Figure 14:
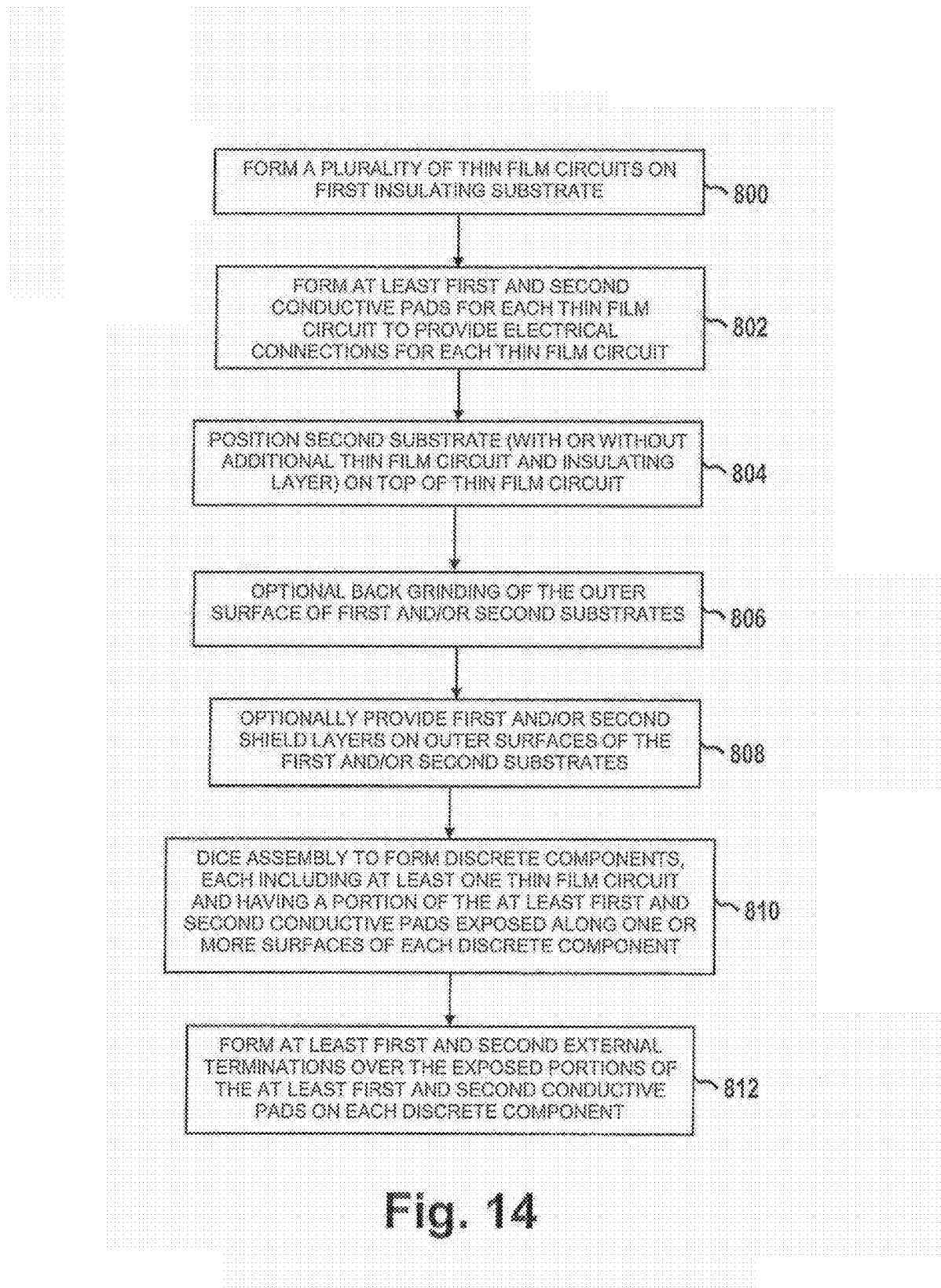
FIG. 14 provides a flow chart of exemplary steps in a method of forming thin film surface mount structures in accordance with aspects of the present technology.

Referring now to FIG. 14, an exemplary flow chart of manufacturing steps that may be practiced to construct a surface mount component in accordance with the present subject matter is shown. Step 800 corresponds to forming a plurality of thin film circuits on a first substrate. First substrate (as well as second substrate ay initially be provided in wafer form. Each thin film circuit may be the same or different and may correspond to one or more of the components or combinations of components described herein. Each thin film circuit may ultimately correspond to a separate discrete component after dicing. It should be appreciated that the advantage achieved in accordance with the disclosed termination arrangement whereby BGA, LGA and wire bonding features are eliminated enables a circuit density formation on a substrate, thus saving space and money in the manufacturing process.

A second exemplary step 802 involves forming at least first and second conductive pads for each thin film circuit to provide electrical connections for each thin film circuit. A second substrate is then positioned in step 804 (with additional circuitry as shown in FIG. 2 or without additional circuitry as shown in FIG. 1) on top of the thin film circuits. As previously discussed, the second substrate may be adhered over the circuits by a sealant layer, passivation layer, adhesive layer, or combination of such layers. Once thin film circuitry is sandwiched between the first and second substrates, an optional grinding step 806 involves back grinding the outer surface of one or both substrates to reduce the thickness of the substrates to the same or different reduced thicknesses. In step 808, the optional first and second shield layers are provided on one or more outer surfaces of the first and second substrates.

Once an entire sandwiched wafer of components is prepared, the assembly is then diced by forming a plurality of orthogonal channels to yield a plurality of discrete surface mount passive components. For example, in step 810 an assembly is diced such that each discrete component includes at least one thin film circuit having a portion of at least first and second conductive pads that are exposed along one or more surfaces of the discrete component. Finally, in step 812, external terminations are formed on each discrete component over the exposed portions of the at least first and second conductive pads.

It can be seen that the presently disclosed technology provides passive components and integrated arrays of components desirably having an efficient arrangement of elements in a very small device package. In addition, advantages are achieved by enabling fixed distances from the thin-film circuits disclosed herein to the circuit board, and particularly to the metal layers or contacts in the board. This circuit to contact distance can be a critical issue, especially for thin film circuits comprising or consisting of RF filters or other RF components in which connection distances must often be accounted for in designing a circuit that will effectively achieve very precise electrical performance characteristics. The fixed distances here are achieved in part by one or more features. For example, the substrate thickness can either be particularly selected or grinded to a desired thickness level. In addition, the distance from a thin-film circuit to the circuit board can be accomplished by both the metal shields on the part or the known distance to the ground layer on the board (if the optional shield(s) is not provided). With the presently disclosed termination arrangement, such distance is firmly maintained by the substrate thickness. This is a particular advantage relative to devices having BGA terminations, where the sometimes unpredictable solder ball collapse distance can later the distance from circuit to board.

One skilled in the art will appreciate that variations and modifications may be made without departing from the spirit and scope of the presently disclosed technology. For example, some of the embodiments shown in the drawings utilize one or more parallel-plate capacitor arrangements where capacitor plates are opposed in an overlapping configuration with a separating layer of dielectric material, one capacitor plate on top of the other. It should be appreciated, however, that various other types of capacitor structures are included within the teachings of the presently disclosed technology. In this regard, it may be desirable in some applications to include within the subject thin film circuitry one or more capacitors that are gap capacitors in which substantially coplanar capacitor electrodes are located on the surface of a substrate or dielectric and are separated by a predetermined gap.

In addition, the above embodiments illustrate substrates which are insulating, or are made insulating before the circuit elements are built up. In some embodiments, such as those configured to have a common ground, it may be desirable to use a conductive substrate. Where a conductive substrate is used it will generally be necessary to isolate some of the circuit elements, such as the resistors and capacitor plates, with discrete insulation.

In addition, some embodiments of the subject technology may utilize one or more substrates made with internal circuitry such as multilayer capacitors, buried resistors or inductors. Incorporation of passive circuit elements into a substrate has been referred to as "embedded" or "integrated" passives and can be implemented using established thick-film processing techniques known in the passive component industry. Examples of known multi-layered printed circuit boards are provided in U.S. Pat. No. 7,006,359 (Galvagni et al.), U.S. Pat. No. 4,800,459 (Takagi et al.), U.S. Pat. No. 5,866,952 (Wojnarowski et al.), U.S. Pat. No. 6,038,133 (Nakatani et al.) and U.S. Pat. No. 6,218,729 (Zavrel, Jr. et al.), all of which are hereby incorporated by reference herein in their entirety for all purposes. Such thick-film substrates having embedded circuits may be designed such that their electrical lead-out portions align with associated lead-out portions of the thin film circuits disclosed herein such that a higher order circuit function is achieved in the finished, terminated device.

In reference to further presently preferred embodiments of exemplary present thin film surface mount components, it should be appreciated that the various surface mount components illustrated and discussed herein make reference to discrete components, although such components may be formed either individually or as an array of multiple components that are diced during manufacturing to form multiple discrete components. The illustration of such components primarily in their discrete component representation should not detract from the option to practice aspects of the subject technology in accordance with multiple components or arrays of components.

Figure 16A:
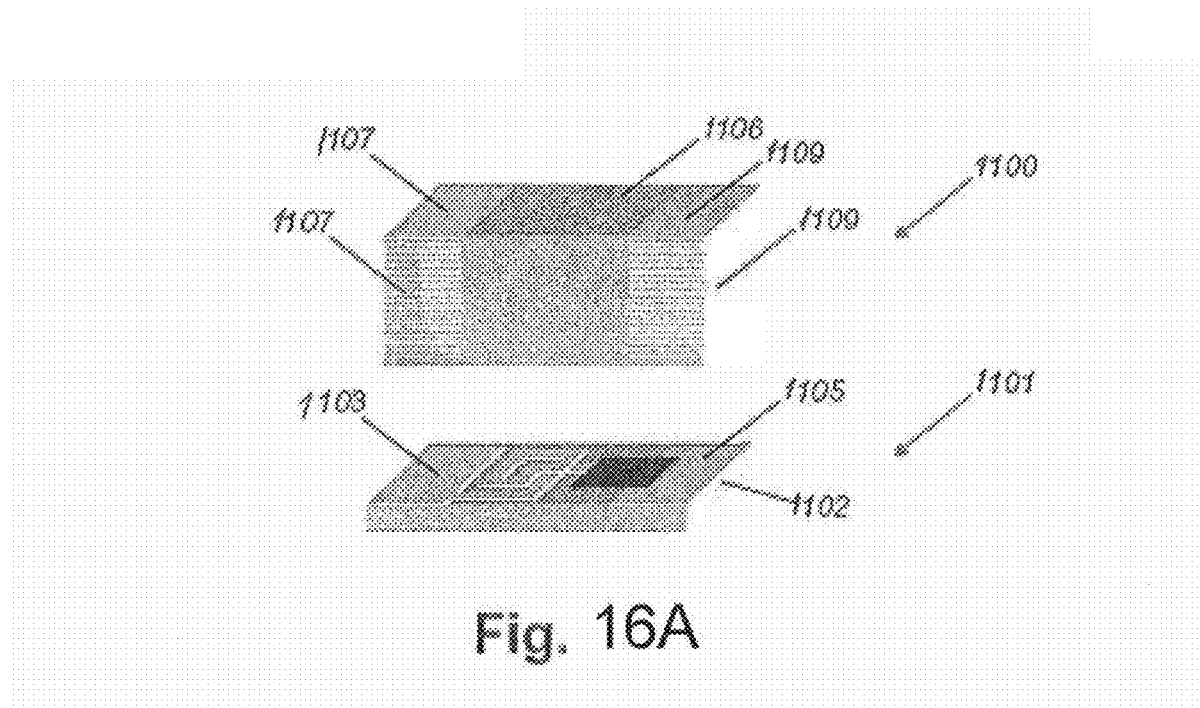
FIG. 16A provides a partially exploded view of an exemplary thin film surface mount electronic component having four-sided terminations in accordance with aspects of the present technology.
Figure 16B:
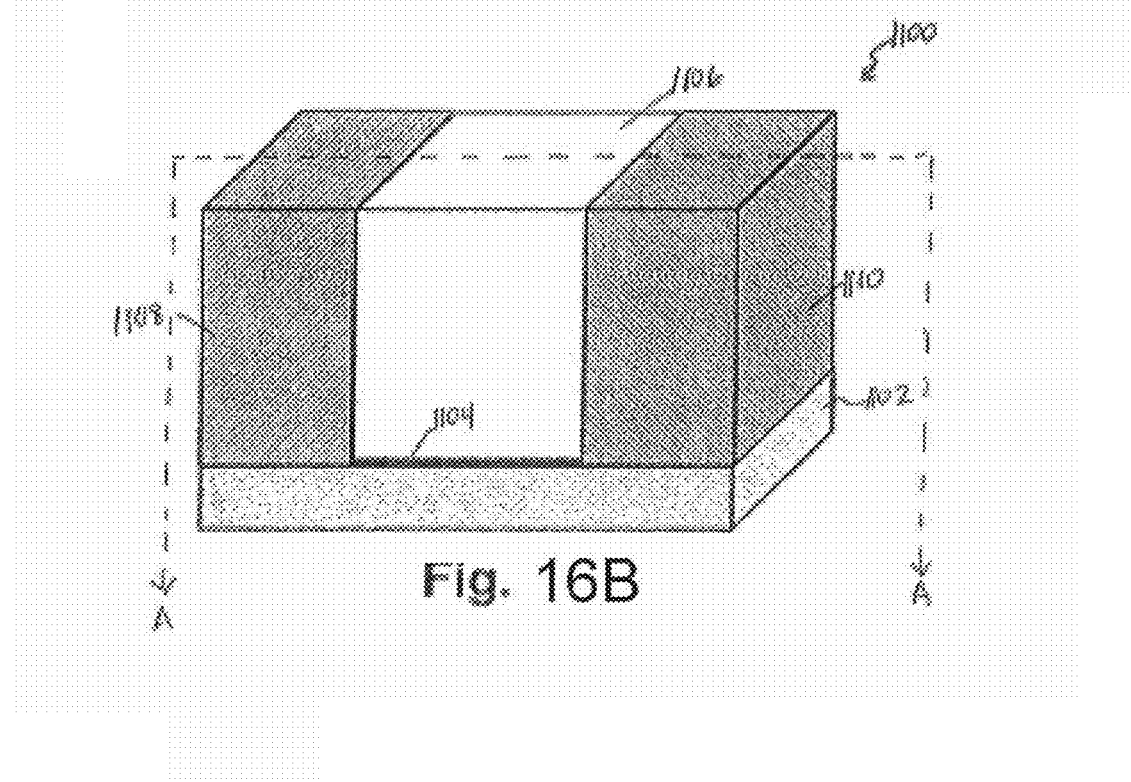
FIG. 16B provides a perspective view of an exemplary thin film surface mount electronic component having four-sided terminations such as depicted in FIG. 16A in accordance with aspects of the present technology.
Figure 17:
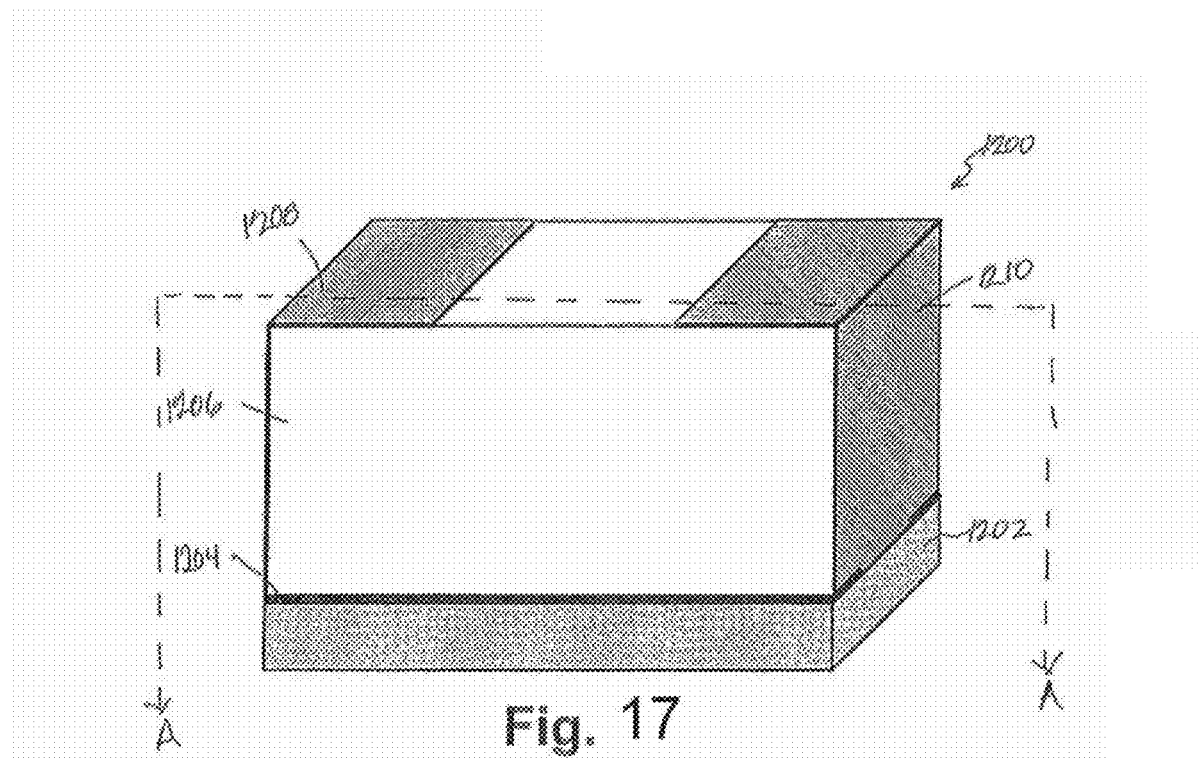
FIG. 17 provides a perspective view of an exemplary thin film surface mount electronic component having two-sided terminations in accordance with aspects of the present technology.

Referring now to other embodiments of the subject technology, FIGS. 16A, 16B and 17 illustrate first and second exemplary surface mount components 1100 and 1200, which both generally include at least one thin film circuit, such as but not limited to a passive micro circuit (PMC). Such thin film circuit(s) are formed on the upper surface of a base substrate 1102 or 1202, for example as shown in the partially exploded view of FIG. 16A having a thin film circuit 1101 formed on the upper surface of base substrate 1102. One ore more conductive pads are also formed on the surface of base substrate 1102, 1202 to provide electrical connection to the thin film circuit(s), for example such as conductive pads 1103 and 1105 as shown in FIG. 16A. One or more portions of such conductive pads extend to and are exposed along one or more peripheral surfaces of the surface mount component 1100, 1200. On top of the thin film circuitry, an adhesive layer 1104, 1204 is provided on top of which is provided a multilayer cover substrate 1106, 1206. The multilayer cover substrates 1106, 1206, or other multilayer cover substrates disclosed herein, generally include internal conductive elements that extend to and are exposed along one or more peripheral surfaces of the surface mount component 1100, 1200. FIG. 16A shows an example of internal conductive elements 1107 and 1109 formed within a multilayer cover substrate 1106. Such internal conductive elements may include active capacitor electrodes and/or anchor electrodes that are interleaved with layered portions of dielectric material as discussed further with respect to FIGS. 18-20. External conductive elements may also optionally be provided relative to the multilayer cover substrate 1106, 1206. The exposure locations of the conductive pads (e.g., 1103, 1105) for the thin film circuit(s) (e.g., 1101) formed on top of the base substrate 1102, 1202 as well as the exposure location of the internal and any external conductive elements (e.g., 1107, 1109) of the multilayer cover substrate 1106, 1206 are particularly positioned such that adjacent exposure locations are close enough to utilize direct plating techniques for the formation of external terminations.

The main difference between the surface mount component embodiments 1100 and 1200 in FIGS. 16A/16B and 17 concerns the formation location of respective external terminations. As will be further understood from the remaining description, the formation location of each external termination is dictated by the exposure location of the thin film circuit conductive pads formed on the surface of base substrates 1102, 1104 as well as the exposure location of the internal and optional external conductive elements associated with multilayer cover substrates 1106, 1206. Referring to FIG. 16B, first and second polarity external terminations 1108 and 1110 in component 1100 of FIG. 16B are formed as four-sided terminations. Each termination 1108, 1110 is formed to substantially cover all of each end surface of the multilayer cover substrate 1106. Each termination 1108, 1110 also wraps around to cover a portion of three adjacent surfaces, two side surfaces and atop surface, of each multilayer cover substrate. Referring to FIG. 17, first and second polarity external terminations 1208 and 1210 are formed to cover part of or the substantial entirety of the end surfaces of the multilayer cover substrate 1206. Each termination 1208, 1210 also wraps around to the top surface of the multilayer cover substrate 1206.

It should be appreciated that other external termination embodiments could be formed on all or part of each surface of the components 1100, 1200, such as on only one surface or three selected surfaces of the components 1100, 1200. It should be further appreciated that although the external terminations 1108, 1110, 1208, 1210 and others as described herein are generally formed over exposed conductive element portions between the base substrate 1102, 1202 and multilayer cover substrate 1106, 1206 and within the multilayer cover substrate 1106, 1206, the external terminations may spread in a lateral direction during formation to slightly cover adjacent portions of the base substrates 1102, 1202 as well.

It should be further appreciated that a variation to the embodiments shown in FIGS. 16A/16B and 17 generally includes the provision of the same or similar elements as shown on atop surface of base substrate 1102, 1202 onto the bottom surface of the same base substrate 1102, 1202. For example, a second thin film circuit(s) may be formed on the bottom surface of base substrate 1102, 1202 on top of which may be provided a second multilayer cover substrate. In this manner, a further surface mount thin film component embodiment may be formed that offers enhanced functionality by providing additional or alternative circuitry in the thin film circuit(s) formed on multiple base substrate surfaces and/or in the active layers of the multiple cover layer substrates. Four separate external terminations would result, thus forming a device with symmetrical terminations such that the device can be mounted on either top or bottom surface. Electrical connection between selected external terminations may be formed with additional connection features such as external termination stripes, internal vias, wire bonding or the like.

In some exemplary embodiments of the presently disclosed technology, base substrates 1102 and 1202, as well as other base substrates discussed herein, may respectively correspond to substantially planar and uniform layers of one or more insulating ceramic or non-ceramic materials, including but not limited to glass, alumina ($Al_2O_3$), aluminum nitride (AlN), beryllium oxide (BeO), gallium arsenide (GaAs), gallium nitride (GaN), indium phosphide, porcelain, quartz, sapphire, silicon (Si), silicon carbide (SiC), ($SiO_2$), silicon nitride ($Si_3N_4$), zirconia ($ZrO_2$), oxides and/or nitrides of such materials or any other insulating thin-film material having a generally high thermal resistance. In some embodiments, such as those configured to have a common ground, it may be desirable to use a conductive substrate. Where a conductive substrate is used it will generally be necessary to isolate some of the circuit elements, such as the resistors and capacitor plates, with discrete insulation.

The thin film circuit formed on one or more base substrate surfaces in the subject components, for example on a surface of the base substrates 1102, 1202 shown in FIGS. 16A/16B and 17, may correspond to any single passive component or combination of passive components. For example, a thin film circuit may include a single resistor, capacitor or inductor. A thin film circuit may correspond to an array of multiple passive components, such as an array of resistors, capacitors and/or inductors provided in a planar array of one or more rows and columns of such components. A thin film circuit may correspond to a combination or network of components, for example a resistor-capacitor (RC) network, filter such as a low-pass filter, EMI or RFI filter, or other combination of passive elements. The one or more layers of conductive materials, dielectric materials, resistive materials, inductive materials, and/or other materials used to form a thin film circuit are precisely formed using "thin film" technology. For example, the respective layer(s) of materials forming a thin film circuit may be applied using specialized techniques based on etching, photolithography, PECVD (Plasma Enhanced Chemical Vapor Deposition) processing or other techniques. Some specific examples of such components will be discussed herein, although it should be appreciated by one of ordinary skill in the art that the potential combinations of such components are endless.

When a thin film circuit consists of or includes a thin film precision resistor, a pattern of resistive material is produced on a substrate surface by photolithography or other suitable patterning technique. Such a resistor pattern may correspond to a selectively applied film of resistive material, such as but not limited to tantalum nitride (TaN), nickel chromium (NiCr), tantalum aluminide, chromium silicon, oxides and/or nitrides of such materials or others, or other suitable thin film resistive materials. Some or all of a resistive pattern may be formed as an arrangement of multiple connected parallel paths (e.g., a serpentine path) that is formed with predetermined spacing between each parallel path portion to help define a desired level of overall resistance based on the width and spacing of the resistive path portions.

When a thin film circuit consists of or includes a thin film surface mount capacitor, such capacitor portion may include first and second conductive electrode layers and an interleaved dielectric layer. A first conductive layer forms the bottom plate of a parallel-plate capacitor and a second conductive layer forms the top plate of the parallel-plate capacitor, and the capacitor plates are opposed in an overlapping configuration with a separating layer of dielectric material, one capacitor plate on top of the other. It should be appreciated, however, that various other types of capacitor structures are included within the teachings of the presently disclosed technology. In this regard, it may be desirable in some applications to include within the subject thin film circuitry one or more capacitors that are gap capacitors in which substantially coplanar capacitor electrodes are located on the surface of a substrate or dielectric and are separated by a predetermined gap.

Different materials known to those of ordinary skill in the art may be selected for forming the electrodes and dielectric material of the subject capacitors. For example, thin film capacitor electrodes may be formed of a variety of different conductive materials, such as but not limited to aluminum, platinum, silver, nickel, copper, palladium, gold, alloys of such materials, multiple layers of combinations of such materials and/or other suitable conductive substances. Dielectric material for a thin film capacitor may comprise a high-K dielectric to achieve a relatively large capacitance value while requiring only a single layer of dielectric material and often a generally small plate area. For example, it may be desirable to utilize a dielectric material exhibiting a dielectric constant of greater than approximately 100, greater than approximately 500, or as high as 10,000 or more in various exemplary embodiments. Specific exemplary materials for use in a dielectric layer for a thin film capacitor may include but are not limited to silicon oxynitride, silicon nitride, silicon oxide, barium titanate, strontium titanate, strontium barium titanate, bismuth strontium tantalate, tantalum, niobium, oxides or nitrides or such materials, NPO (COG), X7R, X7S, Z5U, Y5V formulations, lead-based materials such as doped or non-doped PZT dielectrics, and others.

When a thin film circuit includes a thin film surface mount inductor, such inductor may include first and second conductive layers and an intermediate insulative layer. A first conductive layer is formed to define a first conductive spiral, while a second conductive layer is formed to define a second conductive spiral. An insulative layer may be provided between the first and second conductive layers and may be further formed to define a via or opening therethrough to connect the first and second conductive spirals. The materials forming the conductive and insulating layers in an inductive component may be similar to those described with reference to previous embodiments, especially relative to an exemplary thin film capacitor.

Thin film circuits in accordance with the disclosed technology are not limited to the aforementioned respective single passive components (e.g., a resistor, capacitor and inductor). It should be appreciated that additional components formed in accordance with the disclosed technology may include arrays of one or more passive components, such as resistor arrays, capacitor arrays and/or inductor arrays. In addition, networks of devices may be formed, such as resistor-capacitor networks, an example of which is disclosed in U.S. Pat. No. 6,285,542 (Kennedy, III et al.) assigned to AVX Corporation which is incorporated by reference herein for all purposes. Thin film circuits containing multiple passive components may be formed as filter circuits for various applications including low-pass, electromagnetic interference (EMI) and radio frequency interference (RFI) filtering. Networks and/or filters of multiple passive components may include endless combinations of elements.

Conductive pads may be provided as an integral part of each thin film circuit or as separately formed elements of a surface mount component. At least one conductive pad may be provided to serve as a first (+) polarity connection to each thin film circuit, while at least one second conductive pad may be provided to serve as a second (−) polarity connection to the thin film circuit. Conductive pads may be formed, for example, of a material such as copper, gold, platinum, nickel, silver, palladium or other conductive metals or alloys of such metals.

Referring still to FIGS. 16A/16B and 17, the length and width dimensions of each base substrate 1102, 1202 may be substantially the same as the length and width dimensions of its corresponding cover substrate 1106, 1206. The thicknesses of the base substrates 1102, 1202 and the cover substrates 1106, 1206 may be substantially the same or they may vary. In some embodiments, the thicknesses of the base substrates 1102, 1202 and/or the cover substrates 1106, 1206 can be customized by back grinding the substrates before they are diced to form discrete components. Additional aspects of such methodology are discussed later with reference to FIG. 29. In various exemplary embodiments, the thickness of substrates 1102 and 1202 is between about 0.1-1.0 mm in one embodiment, between about 0.2-0.6 mm in one embodiment, and about 0.5 mm in one embodiment. In various exemplary embodiments, the thickness of substrates 1106 and 1206 is between about 0.15-0.25 mm in one embodiment, between about 0.3-0.6 mm in one embodiment, and about 0.85 mm in one embodiment As previously mentioned, the multilayer cover substrates 1106 and 1206 may include a combination of dielectric material and internal conductive elements. The dielectric material in cover substrates 1106, 1206 may be provided between each adjacent layer of one or more electrodes in an alternating stack. The thickness of the dielectric layers between internal active electrodes and/or anchor electrodes may be selected to provide a predetermined capacitance value for a primary parallel-plate capacitance, while also accommodating thin-film plated terminations as described in this application. During manufacture, the dielectric material and the electrodes may respectively be applied in layers, or sheets, as a cover substrate is being formed. However, it should be appreciated that after firing, a finished cover substrate may be considered as a block of dielectric material in which internal conductive elements are embedded.

Different materials known to those of ordinary skill in the art may be selected for forming the electrodes and dielectric material of the subject cover substrates. For example, internal active electrodes and/or internal anchor electrodes within a multilayer cover substrate and/or external anchor electrodes formed on surfaces of the multilayer cover substrate may be formed of a variety of different conductive materials, such as but not limited to platinum, silver, palladium, nickel, copper, gold, a palladium-silver alloy, combinations of these and/or other conductive materials, or other suitable conductive substances. Dielectric material within a multilayer cover substrate may comprise a ceramic, semiconductive, or insulating material, such as but not limited to barium titanate, calcium titanate, zinc oxide, alumina with low-fire glass, or other suitable ceramic or glass-bonded materials. Alternatively, dielectric material within a multilayer cover substrate may be an organic compound such as an epoxy (with or without ceramic mixed in and with or without fiberglass), popular as circuit board materials, or other plastics common as dielectrics. In these cases the conductor is usually a copper foil which is chemically etched to provide the patterns. In still further embodiments, dielectric material may comprise a material having a relatively high dielectric constant (K), such as one of NPO (COG), X7R, X5R X7S, Z5U, Y5V and strontium titanate. In one example, dielectric material is used that has a dielectric constant within a range from between about 2000 and about 4000.

Figure 18:
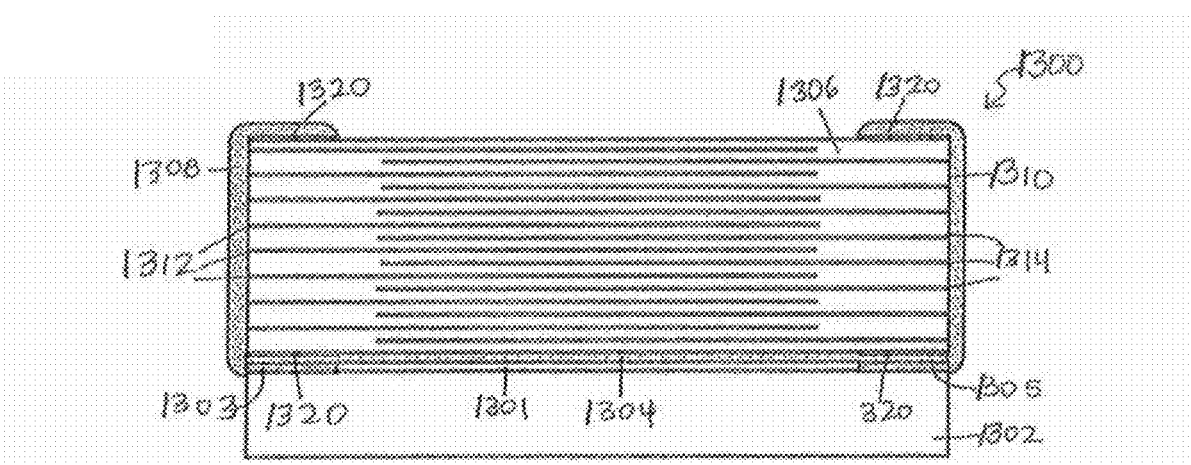
FIG. 18 provides a cross-sectional view of an exemplary thin film surface mount electronic component with a multilayer cover substrate having internal active capacitor electrodes.
Figure 19:
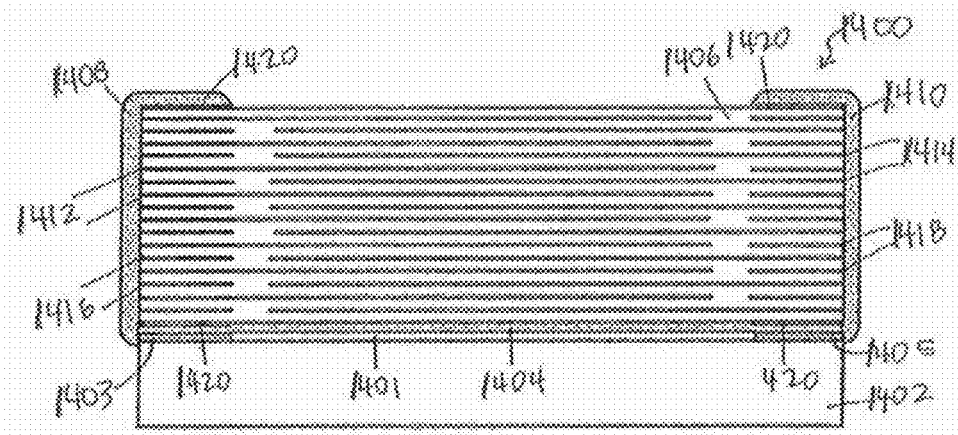
FIG. 19 provides a cross-sectional view of an exemplary thin film surface mount electronic component with a multilayer cover substrate having internal active capacitor electrodes and anchor electrodes.
Figure 20:
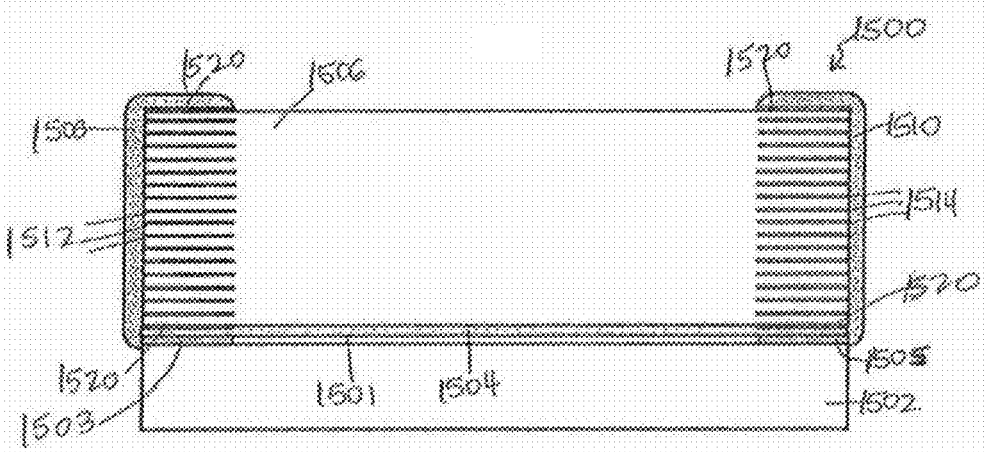
FIG. 20 provides a cross-sectional view of an exemplary thin film surface mount electronic component with a multilayer cover substrate having internal anchor electrodes.

Additional aspects of the present subject matter will be appreciated from the cross-sectional views provided in FIGS. 18-20. FIGS. 18-20 respectively illustrate three different thin film surface mount component embodiments 1300, 1400 and 1500. Although such components are described as separate and distinct embodiments of the present subject matter, it may be helpful to visually consider that the cross-sectional views shown in FIGS. 18-20 could illustrate alternative internal configurations for one or both of the embodiments 1100 or 1200 in FIGS. 16A/16B and 17. For example, FIGS. 18-20 could feasibly show the internal configuration of components 1100 and 1200 as taken along cross-sectional lines A-A of FIGS. 16B and 17.

Referring now to FIG. 18, an exemplary thin film surface mount component embodiment 1300 includes a thin film circuit 1301 formed on a surface of base substrate 1302. At least first and second conductive pads 1303 and 1305 are also formed on the upper surface of base substrate 1302 to form at least first and second electrical connections to thin film circuit 1301. A layer of adhesive 1304 is formed on top of the thin film circuit 1301 and first and second conductive pads 1303, 1305. In alternative embodiments, adhesive layer 1304 is formed only over the thin film circuit 1301 and not over the first and second conductive pads 1303, 1305. On top of adhesive layer 1304 is provided a multilayer cover substrate 1306.

In component 1300, cover substrate 1306 includes layers of dielectric material and alternately interleaved active electrode layers 1312, 1314 that overlap in adjacent electrode planes to form opposing electrodes in respective parallel plate capacitors. A plurality of first active electrodes 1312 are embedded in the multilayer cover substrate 1306 and are electrically connected to first external termination 1308. A plurality of second active electrodes 1314 are embedded in the multilayer cover substrate 1306 and are electrically connected to the second external termination 1310. When terminations 1308 and 1310 are formed as direct plated terminations, the respective active capacitor electrodes 1312 and 1314 extend to and are initially exposed along one or more peripheral surfaces of component 1300. The peripheral exposure location of the active capacitor electrodes 1312 is generally in a columnar alignment with the peripheral exposure location of conductive pad 1303. The peripheral exposure location of the active capacitor electrodes 1314 is generally in a columnar alignment with the peripheral exposure location of conductive pad 1305. External anchor electrodes 1320 may also optionally be provided on top and/or bottom surfaces of the cover substrate 1306 to provide additional exposed conductive surfaces to which external terminations 1308 and 1310 may be adhered.

Referring now to FIG. 19, an exemplary thin film surface mount component embodiment 1400 includes a thin film circuit 1401 formed on a surface of base substrate 1402. At least first and second conductive pads 1403 and 1405 are also formed on the upper surface of base substrate 1402 to form at least first and second electrical connections to thin film circuit 1401. A layer of adhesive 1404 is formed on top of the thin film circuit 1401 and first and second conductive pads 1403, 1405. In alternative embodiments, adhesive layer 1404 is formed only over the thin film circuit 1401 and not over the first and second conductive pads 1403, 1405. On top of adhesive layer 1404 is provided a multilayer cover substrate 1406.

In component 1400, cover substrate 1406 includes layers of dielectric material and alternately interleaved active electrode layers 1412, 1414 that overlap in adjacent planes electrode to form opposing electrodes in respective parallel plate capacitors. The respective active capacitor electrodes 1412 and 1414 extend to and are initially exposed along one or more peripheral surfaces of component 1400. A plurality of first active electrodes 1412 are embedded in the multilayer cover substrate 1406 and are electrically connected to first external termination 1408. A plurality of second active electrodes 1414 are embedded in the multilayer cover substrate 1406 and are electrically connected to the second external termination 1410. Also embedded within the cover substrate 1406 are respective pluralities of first and second anchor electrodes 1416 and 1418. Anchor electrodes 1416 may be formed in substantially the same plane as second active electrodes 1414, although not in direct contact with such active electrodes. Anchor electrodes 1418 may be formed in substantially the same plane as first active electrodes 1412, although not in direct contact with such active electrodes.

Anchor electrodes 1416 and 1418, as well as other anchor electrodes disclosed herein, generally correspond to relatively short tabs of conductive material that typically offer no electrical functionality to a component, but provide mechanical nucleation points and guides for forming plated external terminations along the periphery of a component. Anchor electrodes may be formed of the same, similar or different conductive materials as the internal active electrodes within a multilayer cover substrate. The exposed portions of anchor electrodes in combination with the exposed portions of the internal active electrodes can combine to provide sufficient exposed conductive portions to create more effective self-determining plated terminations. Plated terminations 1408 and 1410 are electrically connected to internal electrodes of component 1400 on opposing surfaces of the component. The peripheral exposure location of the active capacitor electrodes 1412 and anchor electrodes 1416 is generally in a columnar alignment with the peripheral exposure location of conductive pad 1403. The peripheral exposure location of the active capacitor electrodes 1414 and anchor electrodes 1418 is generally in a columnar alignment with the peripheral exposure location of conductive pad 1405. External anchor electrodes 1420 may also optionally be provided on top and/or bottom surfaces of the cover substrate 1406 to provide additional exposed conductive surfaces to which external terminations 1408 and 1410 may be adhered.

Referring now to FIG. 20, a still further exemplary embodiment of a thin film surface mount component 1500 includes a thin film circuit 1501 formed on a surface of base substrate 1502. At least first and second conductive pads 1503 and 1505 are also formed on the upper surface of base substrate 1502 to form at least first and second electrical connections to thin film circuit 1501. A layer of adhesive 1504 is formed on top of the thin film circuit 1501 and first and second conductive pads 1503, 1505. In alternative embodiments, adhesive layer 1504 is formed only over the thin film circuit 1501 and not over the first and second conductive pads 503, 1505. On top of adhesive layer 1504 is provided a multilayer cover substrate 1506.

In component 1500, cover substrate 1506 includes layers of dielectric material and alternately interleaved first and second anchor electrodes 1512 and 1514. A multilayer substrate 1506 having only internal anchor electrodes, is utilized more for its provision of features to implement plated terminations, without simultaneously providing additional multilayer capacitor functionality as in the respective cover substrates 1306 and 1406 of components 1300 and

1400 in FIGS. 18 and 19. The plurality of first anchor electrodes 1512 are embedded in the multilayer cover substrate 1506 and are directly connected to first external termination 1508. The plurality of second active electrodes 1514 are embedded in the multilayer cover substrate 1506 and are electrically connected to the second external termination 1510. The peripheral exposure location of the first anchor electrodes 1512 is generally in a columnar alignment with the peripheral exposure location of conductive pad 1503. The peripheral exposure location of the second anchor electrodes 1514 is generally in a columnar alignment with the peripheral exposure location of conductive pad 1505. External anchor electrodes 1520 may also optionally be provided on top and/or bottom surfaces of the cover substrate 1506 to provide additional exposed conductive surfaces to which external terminations 1508 and 1510 may be adhered.

As appreciated from the exemplary embodiments 1300, 1400 and 1500 in FIGS. 18-20, respectively, the internal conductive elements within the respective multilayer cover substrates of the presently disclosed technology are particularly positioned for precision arrangement of groups of exposure locations. In some embodiments, a first group of internal conductive elements is exposed on a first surface while a second group of internal conductive elements is exposed on a second opposing surface. Exposure locations for internal conductive elements can be provided on multiple adjacent surfaces, e.g., along an entire end surface and portions of two adjacent side surfaces to facilitate the formation of four-sided terminations as shown in FIG. 1B. Anchor electrodes or other conductive elements may also be provided at one or more locations along the top and bottom surfaces of a multilayer substrate to provide additional nucleation points for plated terminations, especially for the portions of external terminations that wrap around to the top surface of a device as shown in FIGS. 16-20. Exposure locations for internal conductive elements can also be provided in more than two groups, such as shown in the multi-terminal embodiments of FIGS. 21-23, respectively.

The distance between exposed portions of conductive pads associated with one or more thin film circuit(s) and/or internal active electrodes and/or internal anchor electrodes and/or external anchor electrodes within each respective group is preferably small enough such that exposure of un-terminated components to a plating solution enables a plating material to be deposited at the exposed conductive portions of each electronic component. Respective external terminations are then formed as plating material continues to deposit during the plating process by lateral spreading and controlled bridging of the plated material among adjacent groups of the exposed conductive elements. Precision control of the exposure locations of conductive elements helps insure continuous metal deposit with no gaps and to potentially improve deposit adhesion of plated material during formation of external electrodes. In some exemplary embodiments, the exposure location distance between each conductive element and an adjacent conductive element within the same group is within a range of between about 2-30 microns. In one example, such distance is between 5-20 microns. In another example, such distance is no greater than about ten microns, and is less than about eight microns in other embodiments (e.g., in a range from between about 2-8 microns). The distance between separate adjacent groups of exposed conductive elements may be at least twice as great as the distance between exposed conductive elements in any given group such that different external terminations remain separate and distinct from one another.

The thickness of exposed conductive element portions may also be precisely chosen in some embodiments. The thickness and exposure location of such conductive element portions may help create a bonding and connection surface for attaching to external terminations and thus implementing a surface mount plated termination structure in accordance with aspects of the disclosed technology. The thickness of conductive pads formed on one or more surfaces of a base substrate as well as the thickness of the internal and external conductive elements associated with a cover substrate (e.g., internal active electrodes, internal anchor electrodes and external anchor electrodes) may be within a range from between about 1-50 microns. In one particular exemplary embodiment, the thickness of conductive pads formed on one or more surfaces of the base substrate is between about 10-20 microns while the thickness of the conductive elements provided within and optionally on one or more outer surfaces of a cover substrate may be within a range between about 1-10 microns. In some embodiments, the thickness of external anchor electrodes is greater than the thickness of internal anchor electrodes. For example, in some embodiments, internal anchor electrodes formed within the body of a multilayer cover substrate may be characterized by an exemplary thickness of about two (2) microns or less, while external anchor electrodes provided on an outer upper or lower surface of a cover substrate may be characterized by an exemplary thickness of about five (5) microns or more. In general, the thickness of external anchor electrodes in some embodiments may be about two times the thickness of internal active electrodes and/or anchor electrodes for added robustness when a resultant electronic component is subjected to mechanical agitation associated with corner rounding or harperizing.

As appreciated from the above discussion, all external terminations disclosed herein may be formed as "plated terminations." Such plated terminations are guided by the positioning of the exposed internal conductive elements. This phenomena is hereafter referred to as "self-determining" since the formation of plated terminations is directly determined by the configuration of exposed metallization at selected peripheral locations on a component. Additional details concerning how such plated terminations may be formed will now be presented.

In some exemplary embodiments of the disclosed technology, external terminations may be formed by depositing a thin-film plating of conductive material to selected exposed electrode portions and ultimately forming "plated terminations." Such plated terminations may be formed by electroplating (or electrochemical deposition), wherein an unterminated stack of fired dielectric and electrode layers with exposed electrode portions is subjected to a plating solution such as electrolytic nickel or electrolytic tin characterized by an electrical bias. The capacitor itself is then biased to a polarity opposite that of the plating solution, and conductive elements in the plating solution are attracted to selected of the exposed electrode portions of the capacitor. An alternative plating technique with no polar biasing is referred to as electroless plating, and can be employed in conjunction with electroless plating solutions such as nickel or copper ionic solution to form any of one or more termination layers.

In accordance with electrochemical plating and/or electroless plating techniques, a batch process such as barrel plating or the like is employed whereby an unterminated capacitor is preferably fully submerged or immersed in an appropriate plating solution for a particular amount of time. With certain embodiments of the present subject matter, no longer than fifteen minutes is required for enough plating material to deposit at selected exposed electrode portions along an electronic component such that buildup is enough to spread the plating material to create a continuous connection among selected adjacent exposed electrode portions of a given polarity.

One particular methodology for forming plated terminations in accordance with the disclosed technology relates to a combination of the above-referenced plating application techniques. An electronic component may first be submersed in an electroless plating solution, such as copper ionic solution, to deposit an initial layer of copper over selected exposed electrode portions. The plating technique may then be switched to an electrolytic plating system which allows for a faster buildup of copper or other plating material on the selected portions of such component. Further assurance of complete plating coverage and bonding of the plated materials may be achieved by including resistance-reducing additives in the plating solution(s). A still further mechanism for enhancing the adhesion of metallic deposit that forms the plated terminations is to thereafter heat the component in accordance with such technologies as baking, laser subjection, UV exposure, microwave exposure, arc welding, etc. Such processes may be generally referred to as "annealing" in some embodiments.

In accordance with the different available techniques for plating material to selected exposed electrode portions of an electronic component in accordance with the present technology, different types of materials may be used to create the plated terminations. For instance, metallic conductors such as nickel, copper, tin, gold, etc. may be utilized as well as suitable resistive conductors or semi-conductive materials (such as are provided in accordance with varistor technology), and/or combinations of selected of these different types of materials. One particular example of terminations corresponds to a first thin-film plating of copper (Cu), followed by a second plating of nickel (Ni), and a third plating of tin (Sn), lead (Ph), gold (Au), or alloyed combinations of such materials. In one embodiment, such a three-layered thin-film termination is formed with an approximate thickness of about ten (10) microns.

Additional aspects of the above-described technology for forming thin-film plated terminations is described in U.S. Pat. No. 7,177,137 to Ritter et al, entitled "Plated Terminations," which is incorporated by reference herein for all purposes and owned by the owner of the present technology. It should be appreciated that additional technologies for forming capacitor terminals may also be within the scope of the present technology. Exemplary alternatives include, but are not limited to, formation of terminations by plating, masking, sputtering, vacuum deposition, printing or other techniques for forming both thick-film or thin-film conductive layers.

It should be appreciated from the above discussion that the possibilities for forming plated external terminations are many. The vast variety of possible implementations is enabled in part by one or more of the batch plating processes disclosed herein, which provide many advantages over conventional termination techniques which rely on printing of thick-film stripes or other techniques that require precision application of termination features to individual components. Additional termination options for a multilayer cover substrate are illustrated, for example, in FIGS. 21-23, respectively.

Figure 21:
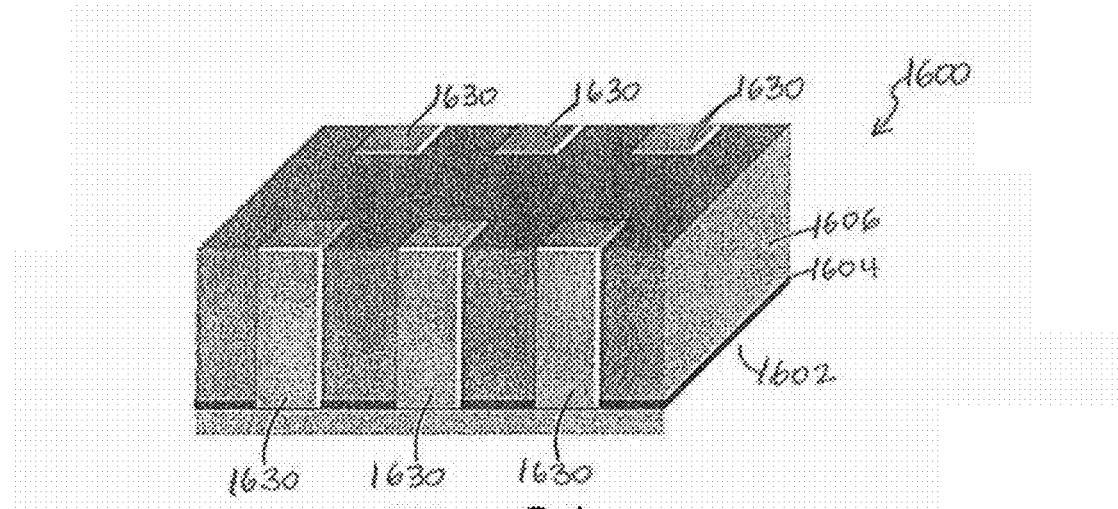
FIG. 21 provides a perspective view of an exemplary thin film surface mount electronic component having two-sided multi-terminal terminations in accordance with aspects of the present technology.

As shown in FIG. 21, one exemplary surface mount component 1600 is provided with two-sided multi-terminal external terminations 1630. Component 1600 includes a base substrate 1602 adhered to a cover substrate 1606 with adhesive layer 1604. Conductive pads provided on a surface of base substrate 1602 as well as conductive elements provided within and along the upper surface of cover substrate 1606 are exposed along the periphery of component 1600 in six columnar groups to facilitate the formation of external terminations 1630. Three external terminations 1630 are formed on one longer side surface of component 1600 while three other external terminations 1630 are formed on the opposing longer side surface of component 1600. All six terminations 1630 also optionally wrap around to the top surface of the component 1600, although this feature is not necessary. It should be appreciated that a fewer or greater number of terminations having the same or varied pitch between terminations may be provided in generally opposing locations along such two side surfaces of component 1600.

Figure 22:
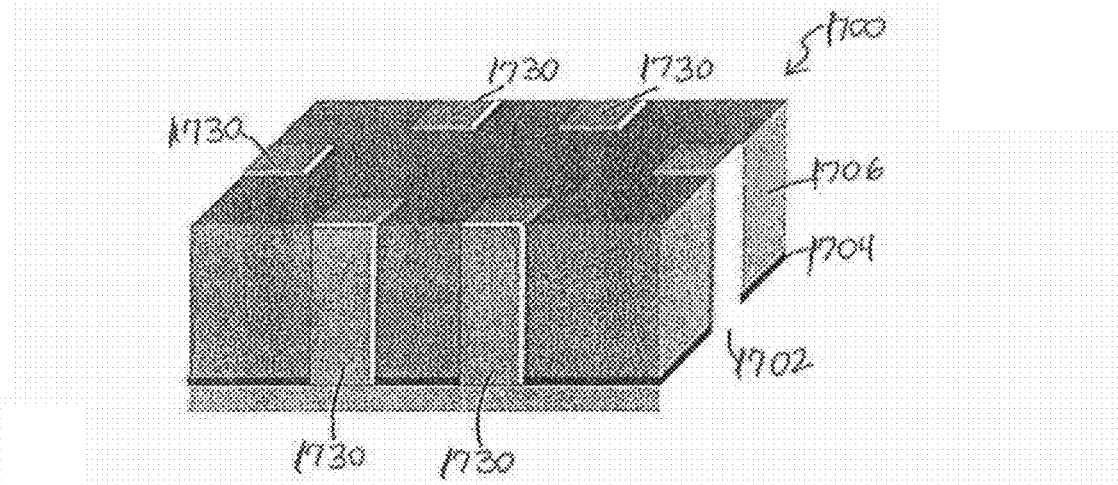
FIG. 22 provides a perspective view of an exemplary thin film surface mount electronic component having four-sided multi-terminal terminations in accordance with aspects of the present technology.

Referring now to FIG. 22, another exemplary surface mount component 1700 is provided with four-sided multi-terminal external terminations 1730. Component 1700 includes a base substrate 1702 adhered to a cover substrate 1706 with adhesive layer 1704. Conductive pads provided on a surface of base substrate 1702 as well as conductive elements provided within and along the upper surface of cover substrate 1706 are exposed along the periphery of component 1700 in six columnar groups to facilitate the formation of external terminations 1730. Two external terminations 1730 are formed on one longer side surface of component 1700 while two other external terminations 1730 are formed on the opposing longer side surface of component 1700. One external termination 1730 is formed on a shorter side surface (i.e., an end surface) of component 1700 while one external termination 1730 is formed on the opposing shorter side surface (i.e., the other end surface) of component 1700. All six terminations 1730 also optionally wrap around to the top surface of the component 1700, although this feature is not necessary. It should be appreciated that a fewer or greater number of terminations having the same or varied pitch between terminations may be provided in selected locations along such four side surfaces of component 1700.

Figure 23:
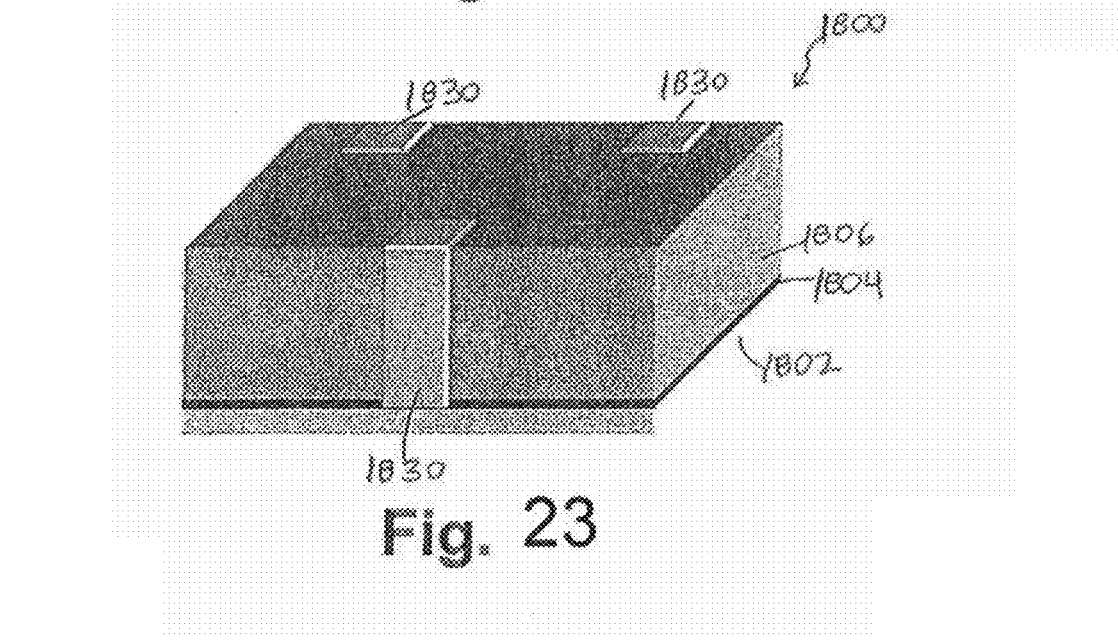
FIG. 23 provides a perspective view of an exemplary thin film surface mount electronic component having asymmetric multi-terminal terminations in accordance with aspects of the present technology.

Referring now to FIG. 23, another exemplary surface mount component 1800 is provided with asymmetric multi-terminal external terminations. Component 1800 includes a base substrate 1802 adhered to a cover substrate 1806 with adhesive layer 1804. Conductive pads provided on a surface of base substrate 1802 as well as conductive elements provided within and along the upper surface of cover substrate 1806 are exposed along the periphery of component 1800 in three columnar groups to facilitate the formation of external terminations 1830. Two external terminations 1830 are formed on one longer side surface of component 1800 while one other external termination is formed on the opposing longer side surface of component 1800. A greater or fewer number of external terminations may be provided on side and/or end surfaces of component 1800. The external terminations can be asymmetrical, and not necessarily positioned in opposing locations as shown in FIGS. 21 and 22. The relative ease by which asymmetric terminations might be formed is an important aspect of some embodiments of the disclosed technology, in that the plated termination process does not require physical orientation of the device, as might be required for prior art methods such as application of metal-loaded inks with screen printing, for example.

Figure 29:
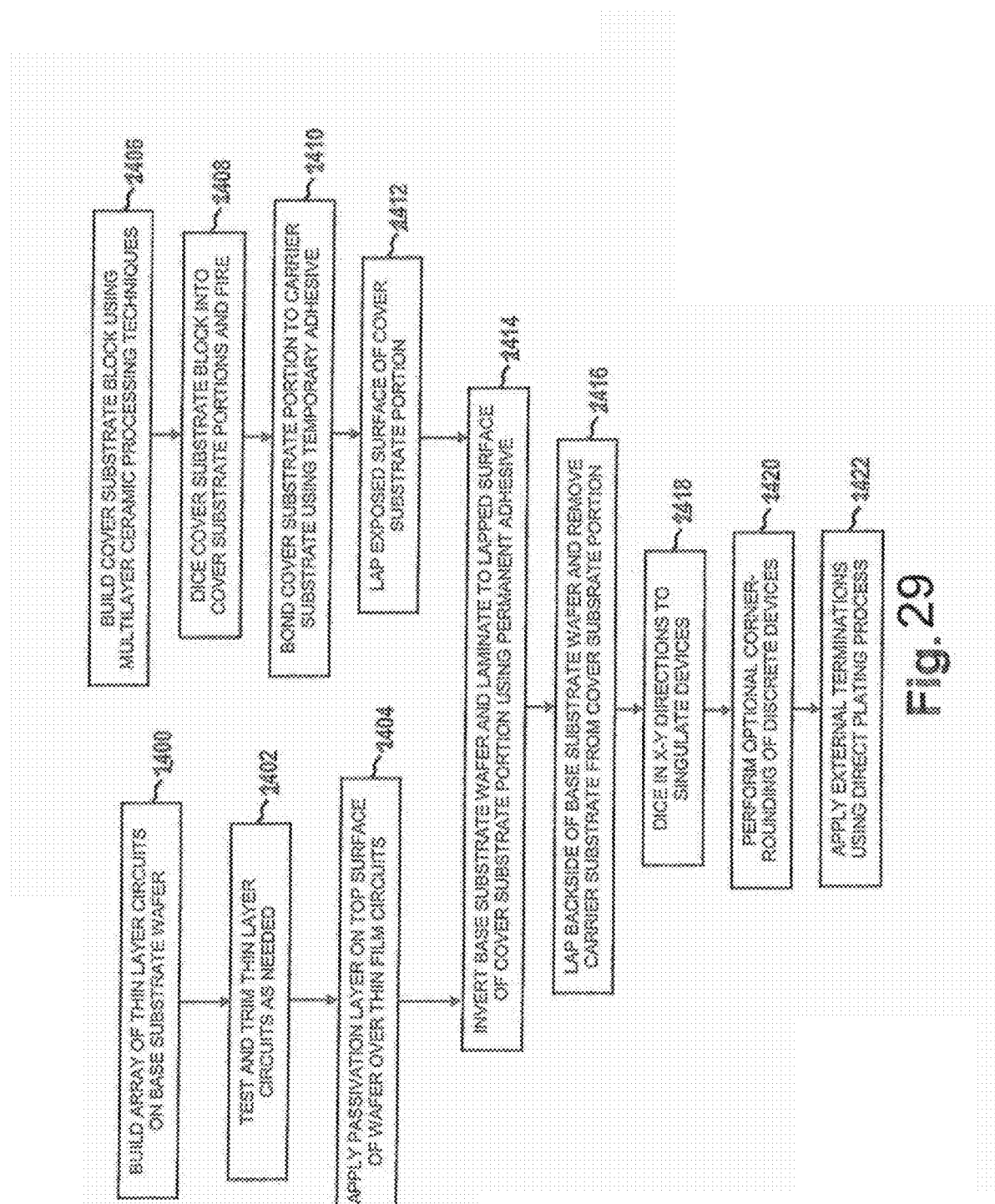
FIG. 29 provides a flow chart of exemplary steps in a method of forming thin film surface mount structures in accordance with aspects of the present technology.

Various exemplary thin film surface mount component embodiments of the present technology having already been described, the remaining discussion focuses on aspects of the present technology generally related to exemplary methodology for making such components. FIG. 29 provides a flow chart of exemplary steps in a method of forming thin film surface mount structures in accordance with aspects of the present technology, while FIGS. 24-28 respectively illustrate various structural configurations present during such method of manufacture.

Referring now to FIG. 29, exemplary steps 2400-2404 generally concern formation of the base substrate and thin film circuits formed on one or more surfaces thereof. Step 2400 concerns building an array of thin film circuits on abase substrate wafer. It should be appreciated that a wafer of material that ultimately is diced to form each base substrate may correspond to a larger surface of any predetermined shape and thickness. Multiple thin film circuits may be formed, with one or more thin film circuits intended for inclusion in each discrete component. Multiple conductive pads providing the exposed electrical connections to each thin film circuit are also formed on the wafer as part of step 2400. In step 2402, the thin film circuits are tested and trimmed as needed. In step 2404, a passivation layer is applied over the top of the wafer to substantially cover and electrically insulate some or all of the thin film circuits and/or conductive pads formed thereon. Exemplary passivation layers may correspond to a material such as benzocyclobutene (BCB) or a polyimide, epoxy, polymer or other inorganic or organic material.

Figure 24:
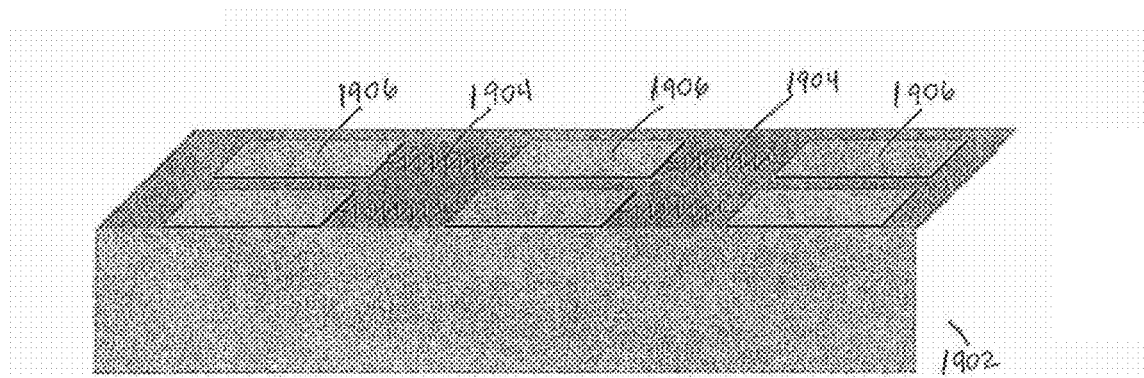
FIG. 24 provides a perspective view of part of a base substrate and associated thin film circuitry provided in accordance with aspects of the present technology.

A partial view of an example of the structure that may result from step 2400 is shown in FIG. 24. As shown in FIG. 24, abuse substrate wafer 1902 forms the base substrate for multiple electronic components. Multiple thin film circuits 1904 and corresponding conductive pads 1906 are formed on the surface of base substrate wafer 1902. Although each thin film circuit 1904 is depicted schematically in FIG. 24 as a resistor, it should be appreciated that each thin film circuit 1904 may correspond to any passive component or combination of such components as previously described. It should be further appreciated that although FIG. 24 shows a wafer 1902 with four thin film circuits 1904 and six conductive pads 1906, a typical wafer substrate will have a much greater surface area to accommodate the formation of many hundreds or more respective thin film circuits and conductive pads.

Referring still to FIG. 29, exemplary steps 2406-2412 generally concern formation of the one or more cover substrates. In step 2406, a cover substrate block is built using multilayer ceramic processing techniques. For example, conductive material(s) and dielectric material(s), such as but not limited to ceramic materials, are prepared. In one example, dielectric material in the form of a "green" ceramic is formed by mixing a ceramic powder with a suitable binder solution (PVA or an acrylic resin) into a dielectric "slip." For preparation of the dielectric layers with "direct lay down" or "wet" techniques, the dielectric layers may be deposited on a carrier substrate by screening, curtain coating, or spraying. Alternatively, in the tape or "dry" process, self supporting tapes are cast using doctor blading or similar techniques. In either process, electrode material is screened onto the ceramic dielectric. The metals used as electrodes may be applied in particle form or after being made into a conductive ink by wetting and mixing the conductive particles with organic screening media. Multiple sets and corresponding sheets of electrode patterns may be interleaved with dielectric layers to form a solid "pad" corresponding to the cover substrate block.

Figure 25:
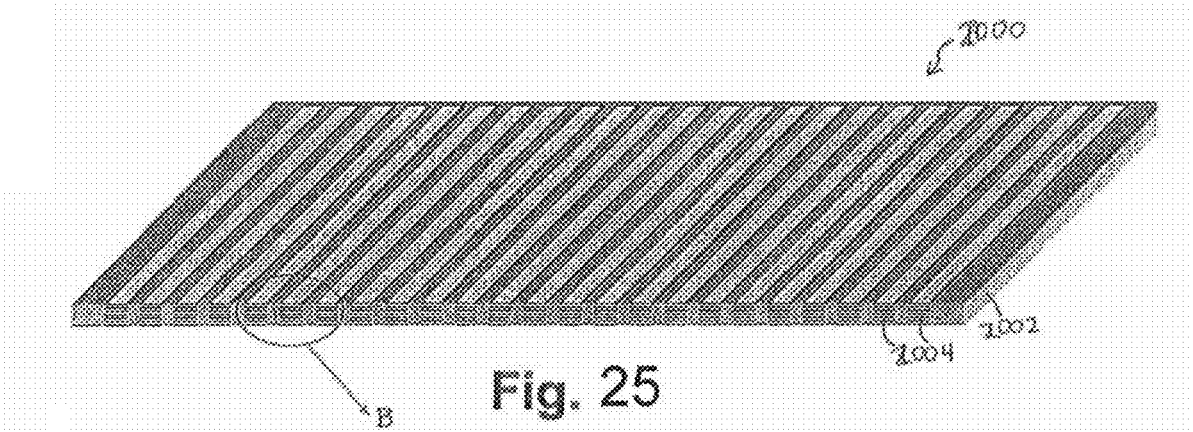
FIG. 25 provides a perspective view of a multilayer cover substrate block manufactured for use in forming exemplary thin film surface mount electronic components in accordance with aspects of the present technology.

FIG. 25 shows an example of a cover substrate block 2000, which ultimately forms the cover substrates for multiple discrete components after dicing. Cover substrate block 2000 includes interleaved layers of dielectric material 2002 and internal conductive elements 2004. The internal conductive elements 2004 may correspond to the same or different sets of active electrodes and/or anchor electrodes or other conductive elements arranged within the dielectric material 2002. A cover substrate block 2000 may then be diced into smaller cover substrate portions and fired in step 2408. Alternatively, the cover substrate block 2000 may be made using organic dielectric and conductors, based on thermoset or thermoplastic materials, which do not require firing.

Figure 26:
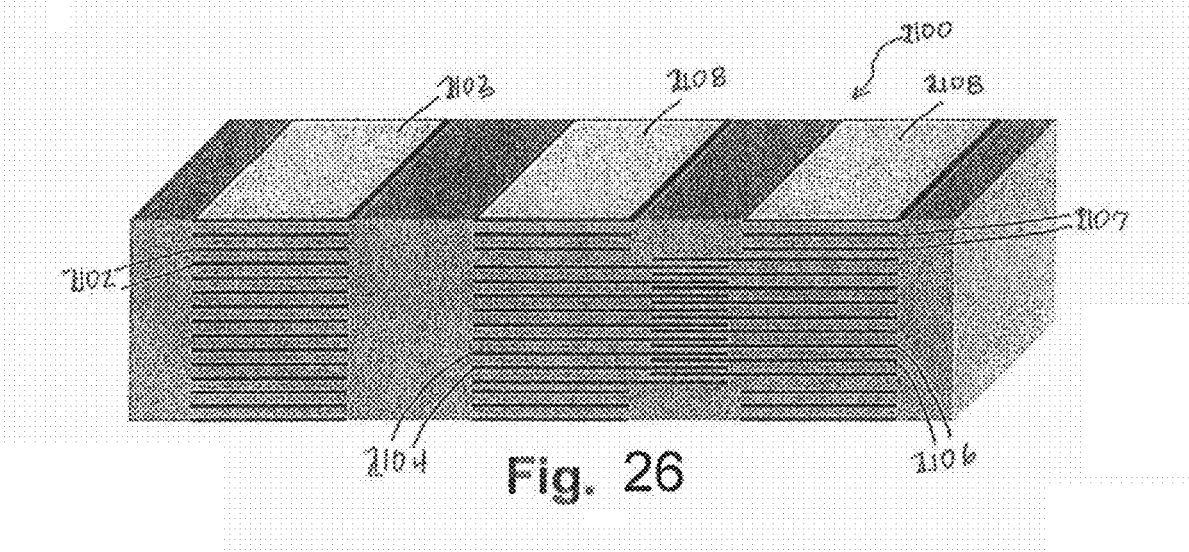
FIG. 26 provides a perspective view of part of a multilayer cover substrate portion manufactured for use in forming exemplary thin film surface mount electronic components in accordance with aspects of the present technology.

An exemplary cover substrate portion 2100 is depicted in FIG. 26, which generally corresponds to a magnified view of area B indicated in FIG. 25. Cover substrate portion 2100 is visually depicted in a limited size matching that of base substrate wafer 1902 from FIG. 24, although it should be appreciated that the cover substrate portion 2100 may actually be much larger. As further shown in FIG. 26, it should be appreciated that cover substrate portion 2100 may include any desired combination of internal conductive elements. For example, some groups of conductive elements may correspond to internal anchor electrodes 2102 and optional external anchor electrodes 2103. Other groups of conductive elements may correspond to internal active electrodes 2104 and 2106 with or without the inclusion of additional internal anchor electrodes 2107 either interspersed among such active electrodes 2104 and 2106 (not shown) or in cover layers (as shown in FIG. 26) as well as optional external anchor electrodes 2108.

Referring again to FIG. 29, step 2410 involves bonding a cover substrate portion to a carrier substrate using temporary adhesive, such as thermal release glue or other suitable material. The exposed surface of the cover substrate portion may then be lapped or grinded in step 2412 to a substantially uniform target thickness. Grinding may be implemented to ensure electrode exposure on the exposed surface, although this is not required since the electrode exposure on one or more side surfaces is where the ultimate electrical connection for a device will occur.

Figures 27, 28:
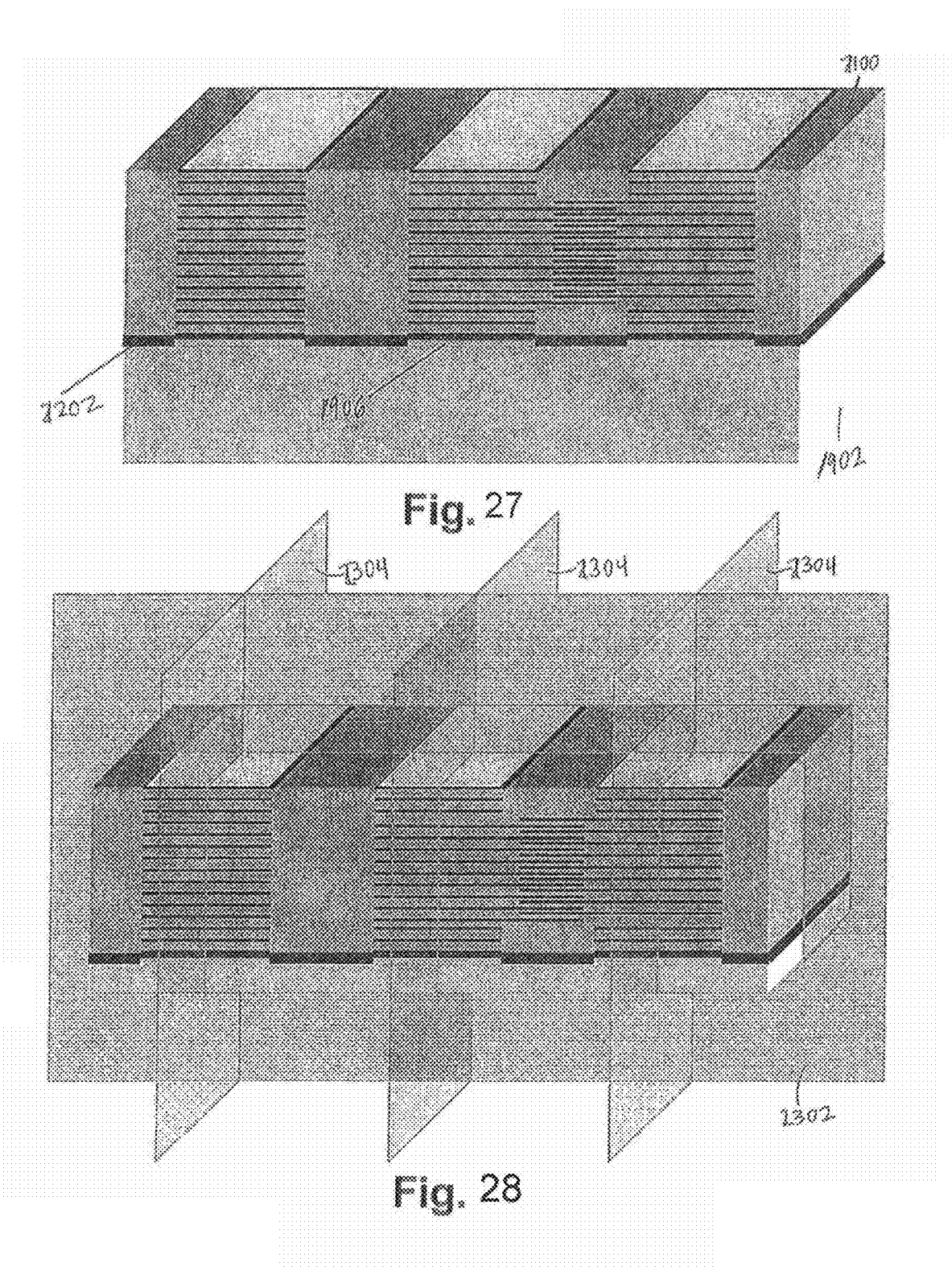
FIG. 27 provides a perspective view of a portion of an integrated assembly including a base substrate portion and a multilayer cover substrate portion, such as shown in FIGS. 10 and 11, in accordance with aspects of the present technology.
FIG. 28 provides a perspective view of an integrated assembly such as shown in FIG. 27 with exemplary dicing locations in accordance with aspects of the present technology.

Referring still to FIG. 29, steps 2414-2422 concern integration of the base and cover substrates and subsequent steps to form a completed thin film surface mount component. In step 2414 (aspects of which are depicted in FIG. 27), a base substrate wafer 1902 is inverted and laminated to the lapped surface of the cover substrate portion 2100 using an adhesive layer 2202. Adhesive layer 2202 may correspond to a low viscosity permanent adhesive such as an epoxy glue, resin, or other natural or synthetic adhesive such as an elastomer, thermoplastic, emulsion, polyvinyl acetate, epoxy, polyurethane, cyanoacrylate polymers, other polymers and others. Proper alignment of the base substrate wafer 1902 and cover substrate portion 2100 may be facilitated by wafer alignment features associated with the base substrate wafer 1902 or built-in alignment notches, markings or other features associated with the base substrate wafer 1902 or the cover substrate portion 2100. The lamination of step 2414 may be conducted with pressure applied to one or more of the base substrate water 1902 and cover substrate portion 2100 such that the adhesive layer 2202 is formed in a relatively thin and uniform fashion. In some exemplary embodiments, the thickness of adhesive layer 2202 is between about 1-15 microns or between about 1-10 microns above the metallization forming the conductive pads.

Step 2416 of FIG. 29 corresponds to lapping or grinding the backside of the base substrate wafer. The total thickness of the laminated stack will equal the finished thickness of an unterminated device. In step 2418, the laminated stack is diced in one or more transverse and longitudinal directions (i.e., x and y directions) to singulate discrete end devices. Exemplary dicing locations are indicated with the planar representations of FIG. 28. For example, the laminated stack of FIG. 28 may be diced in one or more locations defined in the x-direction such as indicated by plane 2302, and one or more locations defined in the y-direction such as indicated by planes 2304.

Once discrete devices are formed, a plurality of such devices may be subjected to an optional corner rounding step 2420. "Corner rounding" is yet another step that may be implemented before actual termination plating in accordance with the present technology in order to effect general rounding of previously sharp edges of an electronic component. Such rounding may promote better termination coverage and device uniformity among parts, as well as reduce potential chipping that might come from handling multiple components having the sharp edges in bulk. In accordance with such "corner rounding", a plurality of discrete devices may be subjected to a predefined level of mechanical agitation either while in the green state, usually with a soft media or none at all, or while in the fired state with media and/or water. This process when applied to components in a fired state is sometimes referred to by those of ordinary skill in the art as "harperizing". The post-firing harperizing process can be particularly important to remove oxidation of the internal electrodes when such oxidation occurs during firing. Electrode oxidation can undesirably inhibit electrical connection between the internal layers and the external terminations. In some embodiments, harperizing may correspond to a high energy mass tumbling process that applies centrifugal finishing to electronic components in order to debur and polish parts in a much shorter period of time than conventional tumbling and vibratory finishing. One example of typical harperizing profile uses a combination of water, −325 mesh alumina powder, 1-2 mm zirconia beads and fired components with eccentric agitation at 150 rpm for sixty (60) minutes. This harperizing profile gives equivalent results to approximately twenty-four (24) hours of low speed tumbling of parts and media, as on a roller miller. Finally, step 2422 involves the application of external terminations with a direct plating process as previously described.

One skilled in the art will also appreciate the many advantages that may be realized in accordance with the disclosed aspects of the present technology. It can be seen that the presently disclosed technology provides passive components and integrated arrays of components desirably having an efficient arrangement of elements in a very small device package.

The complexity of the small size thin-film devices can also be increased allowing multiple termination pads and/or self-aligned precision termination.

In addition, the multilayer cover substrate can contain circuitry, capacitors and other components not realizable in thin-film technology while providing protective functionality with the cover substrate.

The variety of exposure locations of the conductive elements also advantageously affords variety and flexibility in the termination possibilities, with multiple symmetric or asymmetric terminals on any selected component surfaces without the need for expensive tooling/machinery for each terminal configuration.

An additional advantage is realized in that the presently disclosed technology allows for flexible termination geometry on a variety of component sizes, even relatively smaller sizes. Exemplary devices may have dimensions corresponding to 0201, 0402, 0603, 0805, 1206, or other component sizes, where a device size of "XXYY" corresponds to one having a width dimension of 0.XX inches and a length dimension of 0.YY inches. For example, an 0201 size device corresponds to length and width dimensions of about 0.02 inches by 0.01 inches or about 500 microns by about 250 microns.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method of forming thin film surface mount components, comprising:
    forming a plurality of thin film circuits on a first insulating substrate, wherein each of the thin film circuits include at least one passive component;
    providing respective first and second conductive pads on said first insulating substrate, associated with each of said thin film circuits, and respectively electrically connected thereto;
    positioning a second insulating substrate over said plurality of thin film circuits, so as to form an intermediate assembly; and
    selectively dicing said assembly so as to form discrete components that each include:
        at least one thin film circuit that is positioned away from edges of the first and second insulating substrates so as not to be exposed to an external surface of the discrete component;
        at least a portion of said respective first and second conductive pads associated with each thin film circuit that is aligned with the edges of the insulating substrates such that the conductive pads are exposed along at least one surface of the respective discrete component; and
        first and second electrical connectors between the first and second insulating substrates and the electrical connectors connecting the conductive pads with each thin film circuit.

2. A method as in claim 1, further including providing an insulating layer over said plurality of thin film circuits with a further plurality of thin films circuits received on such insulating layer, before positioning of said second insulating substrate, so as to form two layers of plural thin film circuits separated by said insulating layer and collectively sandwiched between said first and second insulating substrates.

3. A method as in claim 1, wherein said first insulating substrate comprises a base substrate and said second insulating substrate comprises a cover substrate.

4. A method as in claim 3, wherein said cover substrate further includes a multilayer structure including internal active capacitor electrodes.

5. A method as in claim 1, further including selectively sizing said first and second insulating substrates.

6. A method as in claim 1, further including providing external shield layers on said first and second insulating substrates prior to dicing of said assembly.

7. A method as in claim 1, further including forming external terminations over the exposed portions of said respective first and second conductive pads associated with each of the respective discrete components.

8. A method as in claim 7, wherein said respective discrete components comprise multisided components and said external terminations comprise one of two-sided terminations, four-sided terminations, and asymmetrical multi-sided terminations.

9. A method as in claim 3, wherein:
said cover substrate further includes a multilayer structure including at least one of internal and external anchor electrodes; and
said method further includes forming external terminations on each of the respective discrete components, guided by such anchor electrodes.

10. A method as in claim 1, wherein said thin film circuits comprise respectively at least one of passive components including resistors, capacitors, and inductors.

11. A method as in claim 1, wherein said thin film circuits comprise respectively arrays of one of passive components, networks and filters.

12. A method as in claim 1, wherein the first and second insulating substrates comprise one or more insulating ceramic based components.

13. A method as in claim 12, wherein the first and second insulating substrates comprise one or more multilayer ceramic based components.

14. A method as in claim 11, wherein the thin film circuits comprise multiple passive components provided in a planar array of one or more rows and columns of such components.

15. A method as in claim 1, wherein the first and second insulating substrates are grinded to a predetermined thickness level.

16. A method of forming thin film surface mount components for mounting on a circuit board, comprising:
fabricating an array of thin layer circuits on a base substrate wafer, including forming a plurality of thin film devices on a first insulating substrate, and providing respective first and second conductive pads on said first insulating substrate, associated with each of said thin film devices, and respectively electrically connected thereto;
preparing a multilayer ceramic cover substrate;
joining said cover substrate with said fabricated array; and
dicing the resulting joined structure so as to form singulated structures, wherein the thin film circuits contained in the simulated structures are positioned away from edges of the base substrate wafer and cover substrate so as not to be exposed to an external surface of the simulated structures.

17. A method as in claim 16, wherein said joining includes applying a passivation layer to a facing surface of said base substrate wafer, and laminating said cover substrate to said base substrate wafer.

18. A method as in claim 16, wherein said joining includes laminating said cover substrate to said base substrate wafer with at least a portion of said respective first and second conductive pads exposed along at least one surface of the respective diced singulated structures.

19. A method as in claim 18, further including forming external terminations on said singulated structures over the exposed portions of said respective first and second conductive pads associated with each of the respective diced singulated structures.

20. A method as in claim 19, wherein said respective diced singulated structures comprise multisided components and said external terminations comprise one of two-sided terminations, four-sided terminations, and asymmetrical multi-sided terminations.

21. A method as in claim 16, further including performing corner-rounding on said singulated structures.

22. A method as in claim 16, further including forming external terminations on said singulated structures.

* * * * *